United States Patent
Kim et al.

(10) Patent No.: US 11,557,614 B2
(45) Date of Patent: Jan. 17, 2023

(54) METHOD OF FABRICATING CONDUCTIVE PATTERN, DISPLAY DEVICE, AND METHOD OF FABRICATING DISPLAY DEVICE

(71) Applicant: Samsung Display Co., LTD., Yongin-si (KR)

(72) Inventors: Jae Uoon Kim, Hwaseong-si (KR); Hong Sick Park, Suwon-si (KR); Jong Hyun Choung, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 127 days.

(21) Appl. No.: 17/003,524

(22) Filed: Aug. 26, 2020

(65) Prior Publication Data

US 2021/0249451 A1    Aug. 12, 2021

(30) Foreign Application Priority Data

Feb. 7, 2020    (KR) .................. 10-2020-0014850

(51) Int. Cl.
*H01L 27/12*    (2006.01)
*H01L 27/32*    (2006.01)
*H01L 21/4763*    (2006.01)

(52) U.S. Cl.
CPC ........ *H01L 27/1259* (2013.01); *H01L 27/124* (2013.01); *H01L 27/3248* (2013.01);
(Continued)

(58) Field of Classification Search
CPC .................................................. H01L 27/1259
See application file for complete search history.

(56) References Cited

U.S. PATENT DOCUMENTS

| | | |
|---|---|---|
| 2002/0106825 A1 | 8/2002 | Lee et al. |
| 2002/0176032 A1 | 11/2002 | Maeda et al. |
| 2013/0134424 A1 | 5/2013 | Kim et al. |

FOREIGN PATENT DOCUMENTS

| | | | | |
|---|---|---|---|---|
| CN | 103003861 A | * | 3/2013 | ........... H01L 27/124 |
| EP | 3 331 016 | | 6/2018 | |

(Continued)

OTHER PUBLICATIONS

Extended European Search Report for European Patent Application or Patent No. 21155633.7 dated Aug. 31, 2021.

*Primary Examiner* — Peter M Albrecht
(74) *Attorney, Agent, or Firm* — Kile Park Reed & Houtteman PLLC

(57) ABSTRACT

A method of fabricating a conductive pattern includes forming a conductive metal material layer and a conductive capping material layer on a substrate, forming a photoresist pattern as an etching mask on the conductive capping material layer, forming a first conductive capping pattern by etching the conductive capping material layer with a first etchant, forming a conductive metal layer and a second conductive capping pattern by etching the conductive metal material layer and the first conductive capping pattern with a second etchant, and forming a conductive capping layer by etching the second conductive capping pattern with a third etchant. The second conductive capping pattern includes a first region overlapping the conductive metal layer and a second region not overlapping the conductive metal layer, and the forming of the conductive capping layer includes etching the second region of the second conductive capping pattern to form the conductive capping layer.

22 Claims, 16 Drawing Sheets

(52) U.S. Cl.
CPC .... *H01L 27/3276* (2013.01); *H01L 21/47635* (2013.01); *H01L 27/1225* (2013.01); *H01L 27/322* (2013.01)

(56) References Cited

FOREIGN PATENT DOCUMENTS

| | | |
|---|---|---|
| JP | 6297789 | 3/2018 |
| KR | 10-2005-0090679 | 9/2005 |
| KR | 10-0740937 | 7/2007 |
| KR | 10-0811643 | 3/2008 |
| KR | 10-0813005 | 3/2008 |
| KR | 10-2018-0119718 | 11/2018 |
| WO | 2013/011602 | 1/2013 |

\* cited by examiner

METHOD OF FABRICATING CONDUCTIVE PATTERN, DISPLAY DEVICE, AND METHOD OF FABRICATING DISPLAY DEVICE

CROSS-REFERENCE TO RELATED APPLICATION(S)

This application claims priority to and benefits of Korean Patent Application No. 10-2020-0014850 under 35 U.S.C. § 119 filed on Feb. 7, 2020 in the Korean Intellectual Property Office, the entire contents of which are incorporated herein by reference.

BACKGROUND

1. Technical Field

The disclosure relates to a method of fabricating a conductive pattern, a display device, and a method of fabricating the display device.

2. Description of the Related Art

Display devices have increasingly become of importance with the development of multimedia, and various types of display devices, such as an organic light-emitting diode (OLED) display and a liquid crystal display (LCD), have been used.

A typical display device, which displays an image, may include a display panel such as an OLED display panel or an LCD panel. The OLED display panel may include light-emitting elements such as, for example, light-emitting diodes (LEDs), and the LEDs may be classified into OLEDs using an organic material as a fluorescent material and inorganic LEDs using an inorganic material as a fluorescent material.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments provide a method of fabricating a data conductive layer with high reliability.

Embodiments also provide a display device including a data conductive layer with high reliability and a method of fabricating the display device.

However, embodiments are not restricted to those set forth herein. The above and other embodiments will become more apparent to one of ordinary skill in the art to which the disclosure pertains by referencing the detailed description of the disclosure given below.

According to an embodiment, a method of fabricating a conductive pattern may include forming a conductive metal material layer and a conductive capping material layer on a substrate, forming a photoresist pattern as an etching mask on the conductive capping material layer, forming a first conductive capping pattern by etching the conductive capping material layer with a first etchant, forming a conductive metal layer and a second conductive capping pattern by etching the conductive metal material layer and the first conductive capping pattern with a second etchant, and forming a conductive capping layer by etching the second conductive capping pattern with a third etchant, wherein the second conductive capping pattern may include a first region overlapping the conductive metal layer and a second region not overlapping the conductive metal layer, and the forming of the conductive capping layer may comprise etching the second region of the second conductive capping pattern to form the conductive capping layer.

In an embodiment, the forming of the conductive metal layer may include forming a main metal layer below the conductive capping layer, wherein the main metal layer may be in contact with the conductive capping layer and may include copper (Cu).

In an embodiment, the conductive capping layer may include at least one of an indium tin oxide (ITO) film, a titanium (Ti) film, an indium zinc oxide (IZO) film, and an indium tin zinc oxide (ITZO) film.

In an embodiment, the forming of the conductive capping layer may include aligning sidewalls of the conductive capping layer with sidewalls of the main metal layer, or disposing the sidewalls of the conductive capping layer inside of the sidewalls of the main metal layer.

In an embodiment, the conductive metal layer may include forming a conductive base layer below the main metal layer, wherein the conductive base layer may be in contact with the main metal layer and may include titanium (Ti).

In an embodiment, the forming of the first conductive capping pattern may include over-etching the conductive capping material layer at an over-etch rate in a range of about 100% to about 200%. The over-etch rate of the conductive capping material layer may be determined based on a thickness of the conductive capping material layer, and an etching speed of the first etchant for the conductive capping material layer may be higher than an etching speed of the first etchant for the conductive metal material layer. The forming of the first conductive capping pattern may include forming sidewalls of the first conductive capping pattern inside of sidewalls of the photoresist pattern by the over-etching of the conductive material layer.

In an embodiment, the forming of the conductive capping layer may comprise over-etching the second conductive capping pattern at an over-etch rate of about 10% or lower, and the over-etch rate of the second conductive capping pattern may be determined based on a thickness of the second region of the second conductive capping pattern.

In an embodiment, the forming of the conductive metal layer may comprise over-etching the conductive metal material layer at an over-etch rate of about 50% or lower, and the over-etch rate of the conductive metal material layer may be determined based on a thickness of the conductive metal material layer.

In an embodiment, the forming of the first conductive capping pattern may comprise exposing a region of the conductive metal material layer that does not overlap the photoresist pattern.

In an embodiment, an etching speed of the second etchant for the conductive capping material layer may be lower than an etching speed of the second etchant for the conductive metal material layer.

In an embodiment, the first etchant and the third etchant may be a same etchant, and an etching duration of the etching of the conductive capping material layer with the first etchant may be longer than an etching duration of the second conductive capping pattern with the third etchant.

In an embodiment, the first etchant and the third etchant may be different etchants, and an etching speed of the third etchant for the conductive capping material layer may be lower than an etching speed of the first etchant for the conductive capping material layer.

In an embodiment, the method of fabricating a conductive pattern may further include removing the photoresist pattern after forming the conductive capping layer.

According to an embodiment a method of fabricating a display device may include preparing a substrate including a display area and a pad area; forming a data conductive layer which may include source and drain electrodes disposed in the display area and a wire pad disposed in the pad area; a data conductive metal layer disposed on the substrate; and a data capping layer disposed on the data conductive metal layer, wherein the forming of the data conductive layer may comprise forming a material layer for the data conductive metal layer and a material layer for the data capping layer on the substrate; forming a photoresist pattern as an etching mask on the material layer for the data capping layer; forming a first data capping pattern layer by etching the material layer for the data capping layer with a first etchant; forming the data conductive metal layer and a second data capping pattern layer on the data conductive metal layer, by etching the material layer for the data conductive metal layer and the first data capping pattern layer on the material layer for the data conductive metal layer with a second etchant; and forming the data capping layer by etching the second data capping pattern layer with a third etchant, and wherein the forming of the first data capping pattern layer may include exposing a part of the material layer for the data conductive metal layer that does not overlap the photoresist pattern.

In an embodiment, the forming of the data conductive metal layer may include forming a data main metal layer below the data capping layer, wherein the data main metal layer may be in contact with the data capping layer and may include copper (Cu).

In an embodiment, the data capping layer may include at least one of an indium tin oxide (ITO) film, a titanium (Ti) film, an indium zinc oxide (IZO) film, and an indium tin zinc oxide (ITZO) film.

In an embodiment, an etching speed of the second etchant for the material layer for the data capping material layer may be lower than an etching speed of the second etchant for the material layer for the data conductive metal layer.

In an embodiment, wherein the etching of the material layer for the data conductive metal layer and the first data capping pattern layer with the second etchant may include forming in the second data capping pattern layer a first region that overlaps the data conductive metal layer; and a second region that does not overlap the data conductive metal layer and overlaps the photoresist pattern.

In an embodiment, the forming of the data capping layer may include aligning sidewalls of the data capping layer with sidewalls of the data conductive metal layer, or disposing the sidewalls of the data capping layer inside of the sidewalls of the sidewalls of the data conductive metal layer.

In an embodiment, the forming of the first data capping pattern layer may comprise over-etching the material layer for the data capping layer at an over-etch rate in a range of about 100% to about 200%, wherein the over-etch rate of the material layer for the data capping layer may be determined based on a thickness of the material layer for the data capping layer, an etching speed of the first etchant for the material layer for the data capping layer may be higher than an etching speed of the first etchant for the material layer for the data conductive metal layer. The forming of the first data capping pattern layer may include forming sidewalls of the first data capping pattern layer inside of sidewalls of the photoresist pattern by the over-etching of the material layer for the data capping layer.

In an embodiment, the forming of the data capping layer may comprise over-etching the second data capping pattern layer at an over-etch rate of about 10% or lower, the second data capping pattern layer may include a first region overlapping the data conductive metal layer, and a second region not overlapping the data conductive metal layer, and the over-etch rate of the second data capping pattern layer may be determined based on a thickness of the second region of the second data capping pattern layer.

In an embodiment, the forming of the data conductive metal layer may comprise over-etching the material layer for the data conductive metal layer at an over-etch rate of about 50% or lower, and the over-etch rate of the material layer for the data conductive metal layer may be determined based on a thickness of the material layer for the data conductive metal layer.

According to an embodiment, a display device may include a substrate including a display area and a pad area, a data conductive layer including source and drain electrodes disposed in the display area and a wire pad disposed in the pad area and exposed by a pad opening, and a passivation layer overlapping the source and drain electrodes, a light-emitting element disposed in a pixel, and a driving transistor providing a driving current to the light-emitting element, wherein the data conductive layer may further include a data conductive metal layer disposed on the substrate; and a data capping layer disposed on the data conductive metal layer, the data conductive metal layer may include copper (Cu), the data capping layer may include a material that may have an etching rate slower than an etching rate of copper (Cu), and sidewalls of the data capping layer may be aligned with or disposed inside of sidewalls of the data conductive metal layer.

In an embodiment, the data capping layer may include at least one of an indium tin oxide (ITO) film, a titanium (Ti) film, an indium zinc oxide (IZO) film, and an indium tin zinc oxide (ITZO) film.

According to the aforementioned and other embodiments, a data conductive layer is provided on a substrate including a display area and a pad area. The data conductive layer may include a data conductive metal layer which may include Cu, and a data capping layer which may include a material that is etched slower than Cu. The data conductive pattern layer may be patterned to include source and drain electrodes which are disposed in the display area, and a wire pad which is disposed in the pad area. During the patterning of the data conductive layer, the data capping layer may be over-etched first as a first etching step to leave no residual data capping layer. In this manner, smudges may be prevented from being generated due to the data conductive metal layer being over-etched in some areas to completely remove the data capping layer.

Other features and embodiments may be apparent from the following detailed description, the drawings, and the claims.

BRIEF DESCRIPTION OF THE DRAWINGS

The above and other embodiments and features of the disclosure will become more apparent by describing in detail embodiments thereof with reference to the attached drawings, in which.

DETAILED DESCRIPTION OF THE EMBODIMENTS

Figure 1:
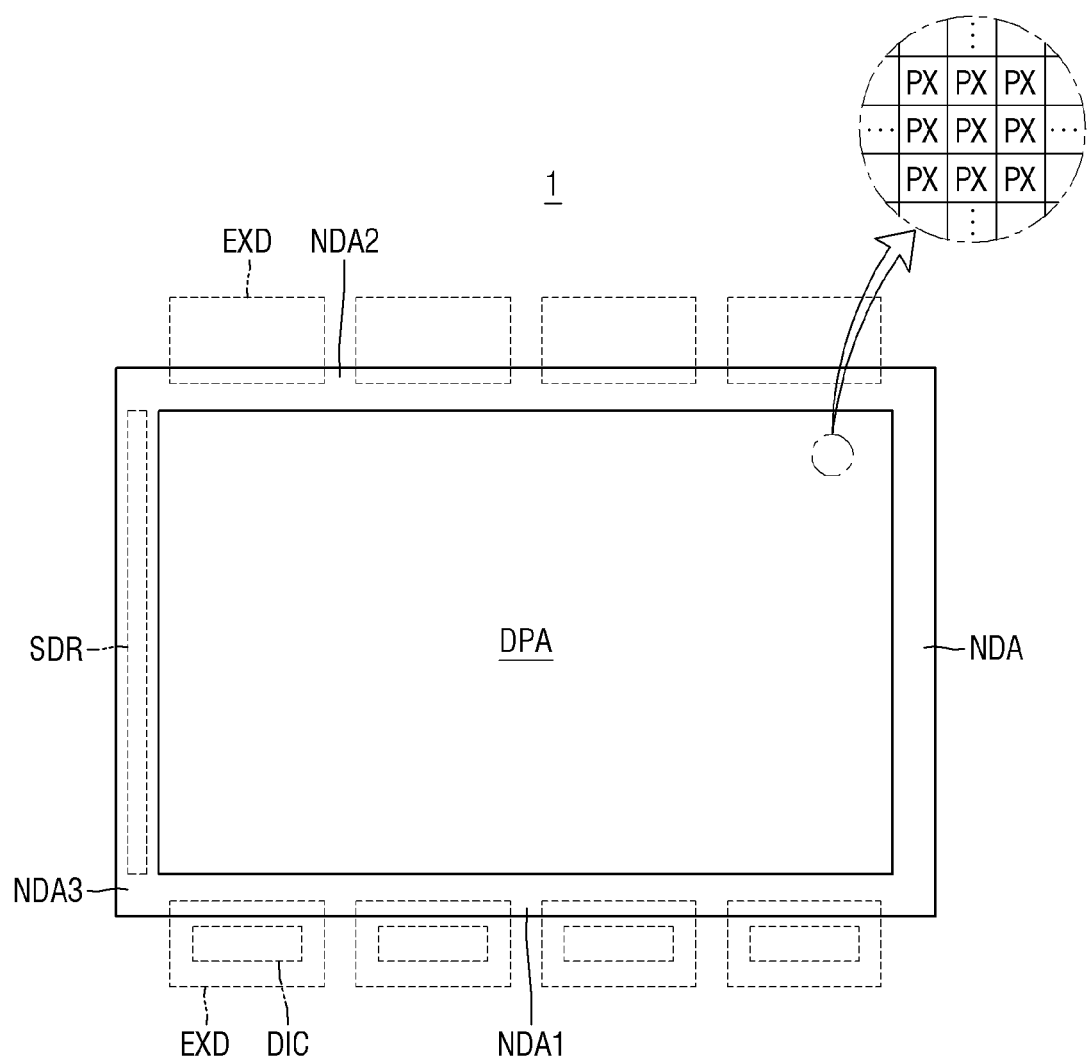
FIG. 1 is a plan view of a display device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

Some of the parts which are not associated with the description may not be provided in order to describe embodiments of the disclosure and like reference numerals refer to like elements throughout the specification.

As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that although the terms "first," "second," etc. may be used herein to describe various components, these components should not be limited by these terms. These components are only used to distinguish one component from another. For example, a first element referred to as a first element in one embodiment may be referred to as a second element in another embodiment without departing from the scope of the appended claims.

As used herein, the singular forms "a," "an" and "the" are intended to include the plural forms as well, unless the context clearly indicates otherwise.

It will be further understood that the terms "comprises" and/or "comprising" "includes" and/or "including", "have" and/or "having" are used in this specification, they or it may specify the presence of stated features, integers, steps, operations, elements and/or components, but do not preclude the presence or addition of other features, integers, steps, operations, elements, components, and/or any combination thereof.

When a layer, film, region, substrate, or area, or element is referred to as being "on" another layer, film, region, substrate, or area, or element, it may be directly on the other film, region, substrate, or area, or element, or intervening films, regions, substrates, or areas, or elements may be present therebetween. Conversely, when a layer, film, region, substrate, or area, or element, is referred to as being "directly on" another layer, film, region, substrate, or area, or element, intervening layers, films, regions, substrates, or areas, may be absent therebetween. Further when a layer, film, region, substrate, or area, or element, is referred to as being "below" another layer, film, region, substrate, or area, or element, it may be directly below the other layer, film, region, substrate, or area, or element, or intervening layers, films, regions, substrates, or areas, or elements, may be present therebetween. Conversely, when a layer, film, region, substrate, or area, or element, is referred to as being "directly below" another layer, film, region, substrate, or area, or element, intervening layers, films, regions, substrates, or areas, or elements may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Sizes of components in the drawings may be exaggerated for convenience of explanation. In other words, since sizes and thicknesses of components in the drawings are arbitrarily illustrated for convenience of explanation, the following embodiments are not limited thereto.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

In the specification, an expression such as "A and/or B" indicates A, B, or A and B. Also, an expression such as "at least one of A and B" indicates A, B, or A and B.

In embodiments below, when a component is referred to as being "on a plane," it is understood that a component is viewed from the top, and when a component is referred to as being "on a schematic cross section," it is understood that the component is vertically cut and viewed from the side.

It will be understood that when a layer, region, or component is referred to as being "connected" or "coupled" to another layer, region, or component, it may be "directly connected" or "directly coupled" to the other layer, region, or component and/or may be "indirectly connected" or "indirectly coupled" to the other layer, region, or component with other layers, regions, or components interposed therebetween. For example, it will be understood that when a layer, region, or component is referred to as being "electrically connected" or "electrically coupled" to another layer, region, or component, it may be "directly electrically connected" or "directly electrically coupled" to the other layer, region, or component and may be "indirectly electrically connected" or "indirectly electrically coupled" to the other layer, region, or component with other layers, regions, or components interposed therebetween.

Also, when an element is referred to as being "in contact" or "contacted" or the like to another element, the element may be in "electrical contact" or in "physical contact" with another element; or in "indirect contact" or in "direct contact" with another element.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that may not be perpendicular to one another.

Unless otherwise defined, all terms (including technical and scientific terms) used herein have the same meaning as commonly understood by one of ordinary skill in the art to which embodiments pertain. In addition, it will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Embodiments will hereinafter be described with reference to the accompanying drawings.

FIG. 1 is a plan view of a display device 1 according to an embodiment.

Referring to FIG. 1, the display device 1 may refer to all electronic devices that may include a display screen. Examples of the display device 1 may include a television (TV), a notebook computer, a monitor, a billboard, a mobile phone, a smartphone, a tablet personal computer (PC), an electronic watch, a smartwatch, a watchphone, a mobile communication terminal, an electronic notebook, an electronic book reader, a portable multimedia player (PMP), a navigation device, a gaming console, a digital camera, and/or an Internet-of-Things (IoT) device that all may be included in a display device.

The display device 1 is illustrated as being a TV. The display device 1 may have a high or ultrahigh resolution such as high definition (HD), ultrahigh definition (UHD), 4K, or 8K.

The display device 1 may be classified according to how it displays an image. For example, the display device 1 may be classified into an organic light-emitting diode (OLED) display device, an inorganic electroluminescent (EL) display device, a quantum-dot light-emitting diode (QED) display device, a micro-light-emitting diode (micro-LED) display device, a nano-light-emitting diode (nano-LED) display device, a plasma display device (PDP), a field emission display (FED) device, a cathode ray tube (CRT) display device, a liquid crystal display (LCD) device, or an electrophoretic display (EPD) device. The display device 1 will hereinafter be described as being, for example, an OLED display device, and the OLED display device may be simply referred to as the display device 1. However, the disclosure is not limited to this. Various display devices other than an OLED display device may be employed as the display device 1.

The display device 1 may have a substantially rectangular shape in a plan view. In a case where the display device 1 is a TV, the long sides of the display device 1 may be positioned in a horizontal direction, but the disclosure is not limited thereto. Alternatively, the long sides of the display device 1 may be positioned in a vertical direction, or the display device 1 may be rotatably installed so that the long sides of the display device 1 may be variably positioned in the horizontal direction or in the vertical direction.

The display device 1 may include a display area DPA and a non-display area NDA. The display area DPA may be an active region in which an image may be displayed. The display area DPA may have a similar shape to the display device 1, for example, a substantially rectangular shape, in a plan view.

The display area DPA may include pixels PX. The pixels PX may be arranged or disposed in rows and columns in a matrix. The pixels PX may have a substantially rectangular or substantially square shape in a plan view, but the disclosure is not limited thereto. Alternatively, the pixels PX may have a substantially rhombus shape inclined with respect to the direction of one side of the display device 1. The pixels PX may include a pixel PX (hereinafter, the first-pixel color PX) of a first color (for example, red), a pixel PX (hereinafter, the second-color pixel PX) of a second color (for example, green), and a pixel PX (hereinafter, the third-color pixel PX) of a third color (for example, blue). The first-color pixel PX, the second-color pixel PX, and the third-color pixel PX may be alternately arranged or disposed in a stripe manner or a PenTile manner.

The non-display area NDA may be disposed around the display area DPA or may be adjacent to the display area DPA. The non-display area NDA may surround or may be adjacent to the display area DPA completely or partially. The display area DPA may have a substantially rectangular shape, and the non-display area NDA may be disposed adjacent to the four sides of the display area DPA. The non-display area NDA may form the bezel of the display device 1.

Driving circuits or elements that may drive the display area DPA may be disposed in the non-display area NDA. In an embodiment, in first and second non-display areas NDA1 and NDA2, which may be disposed to adjacent to first and second long sides (for example, the lower and upper sides in FIG. 1), respectively, of the display device 1, pad units may be provided or disposed on a display substrate of the display device 1, and external devices EXD may be mounted on pad electrodes in the pad units. Examples of the external devices EXD may include connecting films, printed circuit boards (PCBs), driver integrated circuits (DICs), connectors, and wire connecting films. In a third non-display area NDA3, which may be disposed adjacent to a first short side (for example, the left side in FIG. 1) of the display device 1, a scan driver SDR, which may be formed or disposed directly on the display substrate of the display device 1, may be disposed.

Figure 2:
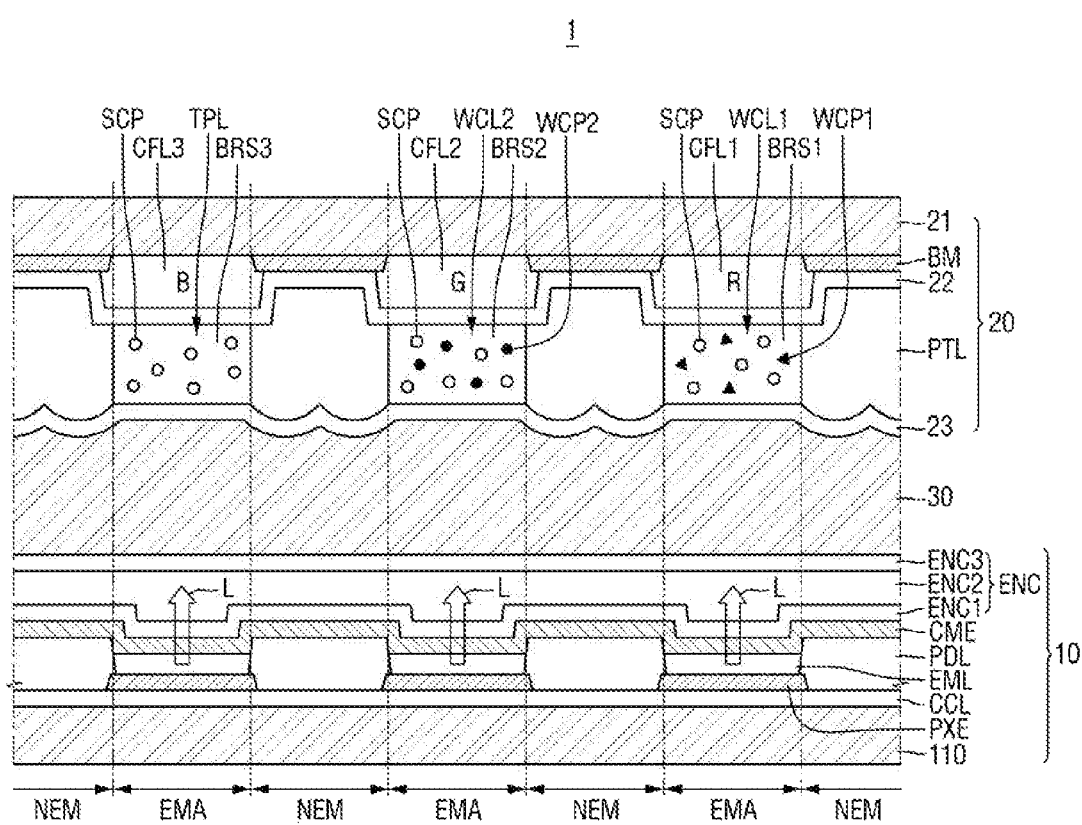
FIG. 2 is a schematic cross-sectional view of the display device of FIG. 1.

FIG. 2 is a schematic cross-sectional view of the display device 1.

FIG. 2 illustrates the display device 1 as being a top emission display device emitting light L in a direction away from a first substrate 110 where emission layers EML may be formed or disposed, for example, in a direction toward a second substrate 21, but the disclosure is not limited thereto.

Referring to FIG. 2, the display device 1 may include the emission layers EML, an encapsulation film ENC, which may cover or overlap the emission layers EML, and a color control structure (WCL, TPL, and CFL), which may be disposed on the encapsulation film ENC. In an embodiment, the display device 1 may include a first display substrate 10 and a second display substrate 20, which may be opposite to the first display substrate 10. The emission layers EML, the encapsulation film ENC, and the color control structure (WCL, TPL, and CFL may be included in one of the first and second display substrates 10 and 20.

For example, the first display substrate 10 may include the first substrate 110, the emission layers EML, which may be disposed on a first surface of the first substrate 110, and the encapsulation film ENC, which may be disposed on the emission layers EML. For example, the second display substrate 20 may include the second substrate 21 and the color control structure (WCL, TPL, and CFL), which may be disposed on a first surface of the second substrate 21 that may face the first substrate 110. The color control structure (WCL, TPL, and CFL) may include color filter layers CFL and a wavelength conversion layer WCL. The color control structure (WCL, TPL, and CFL) may include a light-transmitting layer TPL, which may be disposed on the same layer as the wavelength conversion layer WCL in some or a predetermined number of the pixels PX.

A filler layer 30 may be disposed between the encapsulation film ENC and the color control structure (WCL, TPL, and CFL). The filler layer 30 may fill the space between the first and second display substrates 10 and 20 and may thus bond the first and second display substrates 10 and 20 together.

The first substrate 110 of the first display substrate 10 may be an insulating substrate. The first substrate 110 may include a transparent material. For example, the first substrate 110 may include a transparent insulating material such as glass or quartz. The first substrate 110 may be a rigid substrate, but the disclosure is not limited thereto. Alternatively, the first substrate 110 may include plastic such as polyimide and may have flexibility such as bendability, foldability, and/or rollability.

Pixel electrodes PXE may be disposed on the first surface of the first substrate 110. The pixel electrodes PXE may be disposed in their respective pixels PX. Pixels PXE in a pair of adjacent pixels PX may be separated from each other. A circuit layer CCL, which may drive the pixels PX, may be disposed on the first substrate 110. The circuit layer CCL may be disposed between the first substrate 110 and the pixel electrodes PXE. The circuit layer CCL will be described later in detail.

The pixel electrodes PXE may be the first electrodes (for example, the anode electrodes) of light-emitting diodes (LEDs). The pixel electrodes PXE may have a structure in which a high-work function material layer of, for example, indium tin oxide (ITO), indium zinc oxide (IZO), zinc oxide (ZnO), or indium oxide ($In_2O_3$), and a reflective material layer of, for example, silver (Ag), magnesium (Mg), aluminum (Al), platinum (Pt), lead (Pb), gold (Au), nickel (Ni), neodymium (Nd), iridium (Ir), chromium (Cr), lithium (Li), calcium (Ca), or a mixture thereof, may be stacked. The high-work function material layer may be disposed above the reflective material layer, close to the emission layers EML. The pixel electrodes PXE may have a multilayer structure of ITO/Mg, ITO/MgF, ITO/Ag, or ITO/Ag/ITO, but the disclosure is not limited thereto.

A pixel-defining film PDL may be disposed on the first surface of the first substrate 110 along the boundaries of each of the pixels PX. The pixel-defining film PDL may be disposed on the pixel electrodes PXE and may include openings that may expose the pixel electrodes PXE. Emission areas EMA and non-emission areas NEM may be defined due to the pixel-defining film PDL and the openings of the pixel-defining film PDL. The pixel-defining film PDL may include an organic insulating material such as an acrylic resin, an epoxy resin, a phenolic resin, a polyamide resin, a polyimide resin, an unsaturated polyester resin, a polyphenylene resin, a polyphenylene sulfide resin, or benzocyclobutene (BCB). The pixel-defining film PDL may include an inorganic material.

The emission layers EML may be disposed on the pixel electrodes PXE exposed by the pixel-defining film PDL. In an embodiment where the display device 1 is an OLED display device, each of the emission layers EML may include organic layers that may include an organic material. The organic layers may include organic light-emitting layers and may include hole injection/transport layers and/or electron injection/transport layers as auxiliary layers that may assist with the emission of light. In an embodiment where the display device 1 is an LED display device, the emission layers EML may include an inorganic material such as an inorganic semiconductor.

In an embodiment, each of the emission layers EML may have a tandem structure including organic light-emitting layers, which may be disposed to overlap one another in a thickness direction, and charge-generating layers, which may be disposed between the organic light-emitting layers. The organic light-emitting layers may emit light of the same wavelength or light of different wavelengths. At least some or a predetermined number of the layers of each of the emission layers EML may be separated from the corresponding layers of their respective neighboring emission layers EML.

In an embodiment, the wavelength of light emitted by the emission layers EML may be uniform for all the pixels PX. For example, the emission layers EML of the pixels PX may all emit blue light or ultraviolet (UV) light, and the pixels PX may display their respective colors due to the presence of the wavelength conversion layer WCL of the color control structure (WCL, TPL, and CFL).

In an embodiment, the wavelength of light emitted by the emission layers EML may vary from the first-color pixel PX to the second-color pixel PX to the third-color pixel PX. For example, the emission layer EML of the first-color pixel PX may emit light of the first color, the emission layer EML of the second-color pixel PX may emit light of the second color, and the emission layer EML of the third-color pixel PX may emit light of the third color.

A common electrode CME may be disposed on the emission layers EML. The common electrode CME may be in contact not only with the emission layers EML, but also with the top surface of the pixel-defining film PDL.

Parts of the common electrode CME may all be electrically connected without distinguishing the pixels PX. The common electrode CME may be an electrode disposed over the entire surface of the first substrate 110 without distinguishing the pixels PX. The common electrode CME may be the second electrodes (for example, the cathode electrodes) of LEDs.

The common electrode CME may include a low-work function material layer of Li, Ca, LiF/Ca, LiF/Al, Al, Mg, Ag, Pt, Pd, Ni, Au Nd, Ir, Cr, BaF, Ba, or a compound or mixture thereof (for example, the mixture of Ag and Mg). The common electrode CME may include a transparent metal oxide layer disposed on the low-work function material layer.

The pixel electrodes PXE, the emission layers EML, and the common electrode CME may form light-emitting elements (for example, OLEDs). Light may be emitted upwardly from the emission layers EML through the common electrode CME.

The encapsulation film ENC may be disposed on the common electrode CME. The encapsulation film ENC may include at least one layer. For example, the encapsulation film ENC may include a first inorganic film ENC1, an organic film ENC2, and a second inorganic film ENC3. The first and second inorganic films ENC1 and ENC3 may include silicon nitride, silicon oxide, or silicon oxynitride. The organic film ENC2 may include an organic insulating material such as an acrylic resin, an epoxy resin, a phenolic resin, a polyamide resin, a polyimide resin, an unsaturated polyester resin, a polyphenylene resin, a polyphenylene sulfide resin, or BCB.

The second display substrate 20 may be disposed to face the encapsulation film ENC from above the encapsulation film ENC. The second substrate 21 of the second display substrate 20 may include a transparent material. The second substrate 21 may include a transparent insulating material such as glass or quartz. The second substrate 21 may be a rigid substrate, but the disclosure is not limited thereto. Alternatively, the second substrate 21 may include plastic such as polyimide and may have flexibility such as bendability, foldability, and/or rollability.

The same substrate as the first substrate 110 may be used as the second substrate 21, but the second substrate 21 may have a different material, thickness or transmittance from the first substrate 110. For example, the second substrate 21 may have a higher transmittance than the first substrate 110. For example, the second substrate 21 may be thicker or thinner than the first substrate 110.

A light-blocking member BM may be disposed on the first surface of the second substrate 21 that faces the first substrate 110, along the boundaries of each of the pixels PX. The light-blocking member BM may overlap the pixel-defining film PDL of the first display substrate 10 and may be disposed in the non-emission areas NEM. The light-blocking member BM may include openings that may expose parts of the first surface of the second substrate 21 that may overlap the emission areas EMA. The light-blocking member BM may be formed in a lattice shape in a plan view.

The light-blocking member BM may include an organic material. The light-blocking member BM may reduce any color distortion caused by the reflection of external light by absorbing external light. The light-blocking member may prevent light emitted from the emission layer EML of one pixel PX from infiltrating into the emission layer EML of another pixel PX.

In an embodiment, the light-blocking member BM may absorb all visible wavelengths. The light-blocking member BM may include a light-absorbing material. For example, the light-blocking member BM may include a material that may be used as a black matrix.

The color filter layers CFL may be disposed on the first surface of the second substrate 21 where the light-blocking member BM may be disposed. The color filter layers CFL may be disposed on parts of the first surface of the second substrate 21 exposed by the openings of the light-blocking member BM. The color filter layers CFL may also be disposed on parts of the light-blocking member BM.

The color filter layers CFL may include a first color filter layer CFL1, which may be disposed in the first-color pixel PX, a second color filter layer CFL2, which may be disposed in the second-color pixel PX, and a third color filter layer CFL3, which may be disposed in the third-color filter PX. Each of the color filter layers CFL may include a colorant such as a pigment or dye that may absorb particular wavelengths. The first color filter layer CFL1 may be a red (R) filter layer, the second color filter layer CFL2 may be a green (G) filter layer, and the third color filter layer CFL3 may be a blue (B) filter layer, but the disclosure is not limited thereto. FIG. 2 illustrates that a pair of adjacent color filter layers CFL may be spaced apart from each other over the light-blocking member BM, but may overlap at least partially with each other over the light-blocking member BM.

A first capping layer 22 may be disposed on the color filter layers CFL. The first capping layer 22 may prevent the color filter layers CFL from being damaged or polluted by impurities such as moisture or air from the outside. The first capping layer 22 may prevent the colorants of the color filter layers CFL from diffusing into other elements.

The first capping layer 22 may be in direct contact with first surfaces (for example, the bottom surfaces in FIG. 2) of the color filter layers CFL. The first capping layer 22 may include an inorganic material. For example, the first capping layer 22 may include silicon nitride, aluminum nitride, zirconium nitride, titanium nitride, hafnium nitride, tantalum nitride, silicon oxide, aluminum oxide, titanium oxide, tin oxide, or silicon oxynitride. A partition PTL may be disposed on the first capping layer 22. The partition PTL may be located or disposed in the non-emission areas NEM. The partition PTL may be disposed to overlap the light-blocking member BM. The partition PTL may include openings that may expose the color filter layers CFL. The partition PTL may be formed to include a photosensitive organic material, but the disclosure is not limited thereto. The partition PTL may include a light-blocking material.

The wavelength conversion layer WCL and the light-transmitting layer TPL may be disposed in the spaces exposed by the openings of the partition PTL. The wavelength conversion layer WCL and the light-transmitting layer TPL may be formed by an inkjet process using the partition PTL as a bank, but the disclosure is not limited thereto.

In an embodiment where the emission layers EML of the pixels PX emit light of the third color, the wavelength conversion layer WCL may include a first wavelength conversion pattern WCL1, which may be disposed in the first-color pixel PX, and a second wavelength conversion pattern WCL2, which may be disposed in the second-color pixel PX. The light-transmitting layer TPL may be disposed in the third-color pixel PX.

The first wavelength conversion pattern WCL1 may include a first base resin BRS1 and a first wavelength conversion material WCP1, which may be disposed in the first base resin BRS1. The second wavelength conversion pattern WCL2 may include a second base resin BRS2 and a second wavelength conversion material WCP2, which may be disposed in the second base resin BRS2. The light-transmitting layer TPL may include a third base resin BRS3 and a scatterer SCP, which may be disposed in the third base resin BRS3.

The first, second, and third base resins BRS1, BRS2, and BRS3 may include a light-transmitting organic material. For example, the first, second, and third base resins BRS1, BRS2, and BRS3 may include an epoxy resin, an acrylic resin, a cardo resin, or an imide resin. The first, second, and third base resins BRS1, BRS2, and BRS3 may all include the same or similar material, but the disclosure is not limited thereto.

The scatterer SCP may be particles of a metal oxide or organic particles. For example, the metal oxide may be titanium oxide ($TiO_2$), zirconium oxide ($ZrO_2$), aluminum oxide ($Al_2O_3$), indium oxide ($In_2O_3$), zinc oxide (ZnO), or tin oxide ($SnO_2$), and the material of the organic particles may be an acrylic resin or a urethane resin.

The first wavelength conversion material WCP1 may convert the third color into the first color, and the second wavelength conversion material WCP2 may convert the third color into the second color. The first and second wavelength conversion materials WCP1 and WCP2 may be quantum dots, quantum rods, or phosphors. The quantum dots may include group IV nanocrystals, group II-VI compound nanocrystals, group III-V compound nanocrystals, group IV-VI nanocrystals, or a combination thereof. Each of the first and second wavelength conversion patterns WCL1 and WCL2 may include the scatterer SCP, which may improve the efficiency of wavelength conversion.

The light-transmitting layer TPL, which may be disposed in the third-color pixel PX, may transmit light therethrough of the third color incident thereupon from the light-emitting layer EML of the third-color pixel PX while maintaining the wavelength of the incident light. The scatterer SCP of the light-transmitting layer TPL may control the path of light emitted through the light-transmitting layer TPL. The light-transmitting layer TPL may not include a wavelength conversion material.

A second capping layer 23 may be disposed on the wavelength conversion layer WCL and the light-transmitting layer TPL. The second capping layer 23 may include an inorganic material. The second capping layer 23 may include one selected from the aforementioned materials of the first capping layer 22. The first and second capping layers 22 and 23 may include the same or similar material, but the disclosure is not limited thereto.

The filler layer 30 may be disposed between the first and second display substrates 10 and 20. The filler layer 30 may fill the space between the first and second display substrates 10 and 20 and may also bond the first and second display substrates 10 and 20 together. The filler layer 30 may be disposed between the encapsulation film ENC of the first display substrate 10 and the second capping layer 23 of the second display substrate 20. The filler layer 30 may include a silicon (Si)-based organic material or an epoxy-based organic material, but the disclosure is not limited thereto.

The circuit layer CCL of the display device 1 will hereinafter be described.

Figure 3:
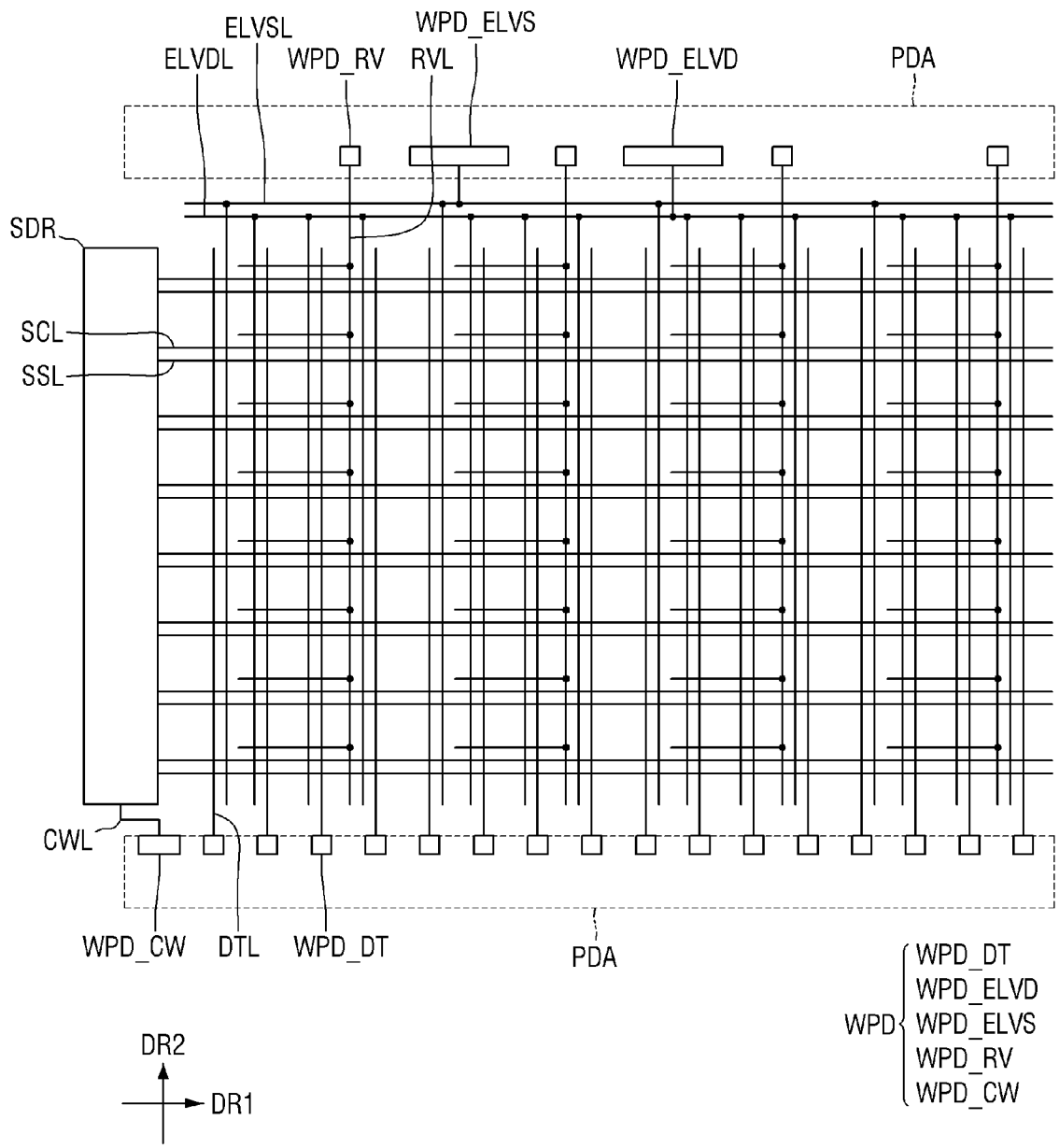
FIG. 3 is a layout view illustrating a first display substrate of the display device of FIG. 1.

FIG. 3 is a layout view illustrating a first display substrate of the display device of FIG. 1.

Referring to FIG. 3, wires may be disposed on the first substrate 110 of the first display substrate 10. The wires may include scan lines SCL, sensing signal lines SSL, data lines DTL, reference voltage lines RVL, a first power supply line ELVDL, and a second power supply line ELVSL.

The scan lines SCL and the sensing signal lines SSL may extend in a first direction DR1. The scan lines SCL and the sensing signal lines SSL may be electrically connected to the scan driver SDR. The scan driver SDR may include driving circuits that may consist of the circuit layer CCL. The scan driver SDR may be disposed in the third non-display area NDA3 on the first substrate 110, but the disclosure is not limited thereto. Alternatively, the scan driver SDR may be disposed in a fourth non-display area NDA that may be disposed adjacent to a second short side (for example, the right side in FIG. 1) of the display device 1 or may be disposed in both the third and fourth non-display areas NDA. The scan driver SDR may be electrically connected to a signal connecting wire CWL, and at least one end of the signal connecting wire CWL may form pads WPD_CW in the first non-display area NDA and/or in the second non-display area NDA and may thus be electrically connected to the external devices EXD of FIG. 1.

The data lines DTL and the reference voltage lines RVL may extend in a second direction DR2 that may intersect the first direction DR1. The first and second power supply lines ELVDL and ELVSL may include parts that extend in the second direction DR2. The first and second power supply lines ELVDL and ELVSL may include parts that extend in the first direction DR1. The first and second power lines ELVDL and ELVSL may have a mesh structure, but the disclosure is not limited thereto.

Wire pads WPD may be disposed at least at first ends of the data lines DTL, the reference voltage lines RVL, the first power supply line ELVDL, and the second power supply line ELVSL. The wire pads WPD may be disposed in the non-display area NDA. In an embodiment, wire pads WPD_DT (hereinafter, the data pads WPD_DT) of the data lines DTL may be disposed in the first non-display area NDA1, and wire pads WPD_RV (hereinafter, the reference voltage pads WPD_RV) of the reference voltage lines RVL, a wire pad WPD_ELVD (hereinafter, the first power supply pad WPD_ELVD) of the first power supply line ELVDL, and a wire pad WPD_ELVS (hereinafter, the second power supply pad WPD_ELVS) of the second power supply line ELVSL may be disposed in the second non-display area NDA2. In an embodiment, the data pads WPD_DT, the reference voltage pads WPD_RV, the first power supply pad WPD_ELVD, and the second power supply pad WPD_ELVS may all be disposed in the same area, for example, in the first non-display area NDA1. The external devices EXD of FIG. 1 may be mounted or disposed on the wire pads WPD. The external devices EXD may be mounted or disposed on the wire pads WPD via anisotropic conductive films or through ultrasonic bonding.

The pixels PX on the first substrate 110 may include pixel driving circuits. The wires may pass through or pass by the pixels PX to apply driving signals to the pixel driving circuits. Each of the pixel driving circuits may include transistors and capacitors. The numbers of transistors and capacitors in each of the pixel driving circuits may vary. The pixel driving circuits will hereinafter be described as having, for example, a "3T1C" structure including three transistors and one capacitor, but the disclosure is not limited thereto. For example, various modified pixel structures such as a "2T1C", "7T1C", or "6T1C" structure may also be applied to the pixel driving circuits of the pixels PX.

Figure 4:
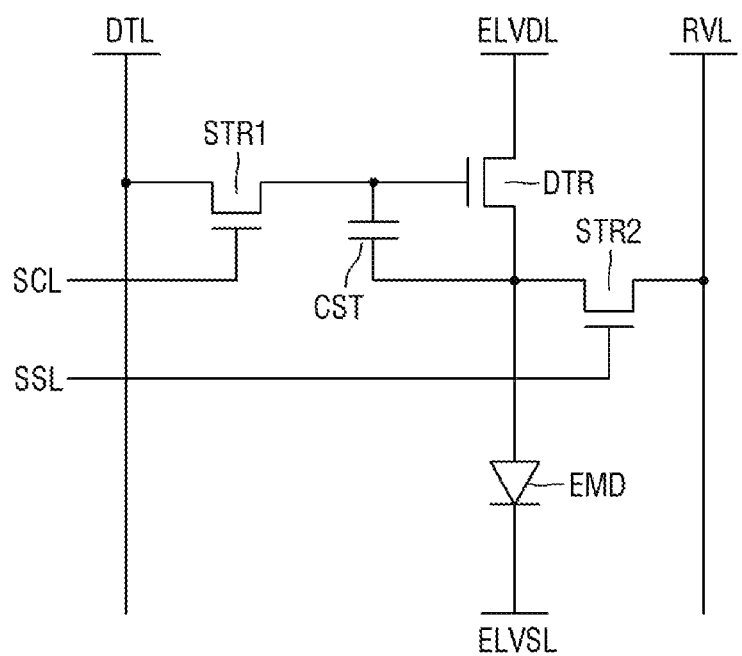
FIG. 4 is an equivalent circuit diagram of a pixel of the display device of FIG. 1.

FIG. 4 is an equivalent circuit diagram of a pixel PX of the display device of FIG. 1.

Referring to FIG. 4, the pixel PX may include a light-emitting element EMD, three transistors, for example, a driving transistor DTR and first and second switching transistors STR1 and STR2, and one capacitor, for example, a storage capacitor CST.

The light-emitting element EMD may emit light in accordance with a current applied thereto via the driving transistor DTR. The light-emitting element EMD may be implemented as an OLED, a micro-LED, or a nano-LED.

A first electrode (for example, an anode electrode) of the light-emitting element EMD may be electrically connected to the source electrode of the driving transistor DTR, and a second electrode (for example, a cathode electrode) of the light-emitting element EMD may be electrically connected to the second power supply line ELVSL to which a low-potential voltage (or a second power supply voltage) lower than a high-potential voltage (or a first power supply voltage) supplied to the first power supply line ELVDL may be supplied.

The driving transistor DTR may adjust a current that may flow from the first power supply line ELVDL to the light-emitting element EMD in accordance with the difference between the gate and source voltages thereof. The gate electrode of the driving transistor DTR may be electrically connected to a second source/drain electrode of the first switching transistor STR1, the source electrode of the driving transistor DTR may be electrically connected to the first electrode of the light-emitting element EMD, and the drain electrode of the driving transistor DTR may be electrically connected to the first power supply line ELVDL.

The first switching transistor STR1 may be turned on by a scan signal from a scan line SCL to electrically connect a data line DTL to the gate electrode of the driving transistor DTR. The gate electrode of the first switching transistor STR1 may be electrically connected to the scan line SCL, a first source/drain electrode of the first switching transistor STR1 may be electrically connected to the data line DTL, and the second source/drain electrode of the first switching transistor STR1 may be electrically connected to the gate electrode of the driving transistor DTR.

The second switching transistor STR2 may be turned on by a sensing signal from a sensing signal line SSL to electrically connect a reference voltage line RVL to the source electrode of the driving transistor DTR. The gate electrode of the second switching transistor STR2 may be electrically connected to the sensing signal line SSL, a first source/drain electrode of the second switching transistor STR2 may be electrically connected to the reference voltage line RVL, and the second source/drain electrode of the second switching transistor STR2 may be electrically connected to the source electrode of the driving transistor DTR.

In an embodiment, the first source/drain electrodes of the first and second switching transistors STR1 and STR2 may be source electrodes, and the second source/drain electrodes of the first and second switching transistors STR1 and STR2 may be drain electrodes. However, the disclosure is not limited to this embodiment. Alternatively, the first source/drain electrodes of the first and second switching transistors STR1 and STR2 may be drain electrodes, and the second source/drain electrodes of the first and second switching transistors STR1 and STR2 may be source electrodes.

The storage capacitor CST may be formed or disposed between the gate electrode and the source electrode of the driving transistor DTR. The storage capacitor CST may store the difference between the gate voltage and the source voltage of the driving transistor DTR.

The driving transistor DTR and the first and second switching transistors STR1 and STR2 may be formed as thin-film transistors (TFTs). FIG. 4 illustrates that the driving transistor DTR and the first and second switching transistors STR1 and STR2 may be formed as N-type metal-oxide semiconductor field-effect transistors (MOSFETs), but the disclosure is not limited thereto. Alternatively, the driving transistor DTR and the first and second switching transistors STR1 and STR2 may be formed as P-type MOSFETs. Alternatively, some or a predetermined number of the driving transistor DTR and the first and second switching transistors STR1 and STR2 may be formed as N-type MOSFETS, and the other transistor(s) may be formed as P-type MOSFETs.

Figure 5:
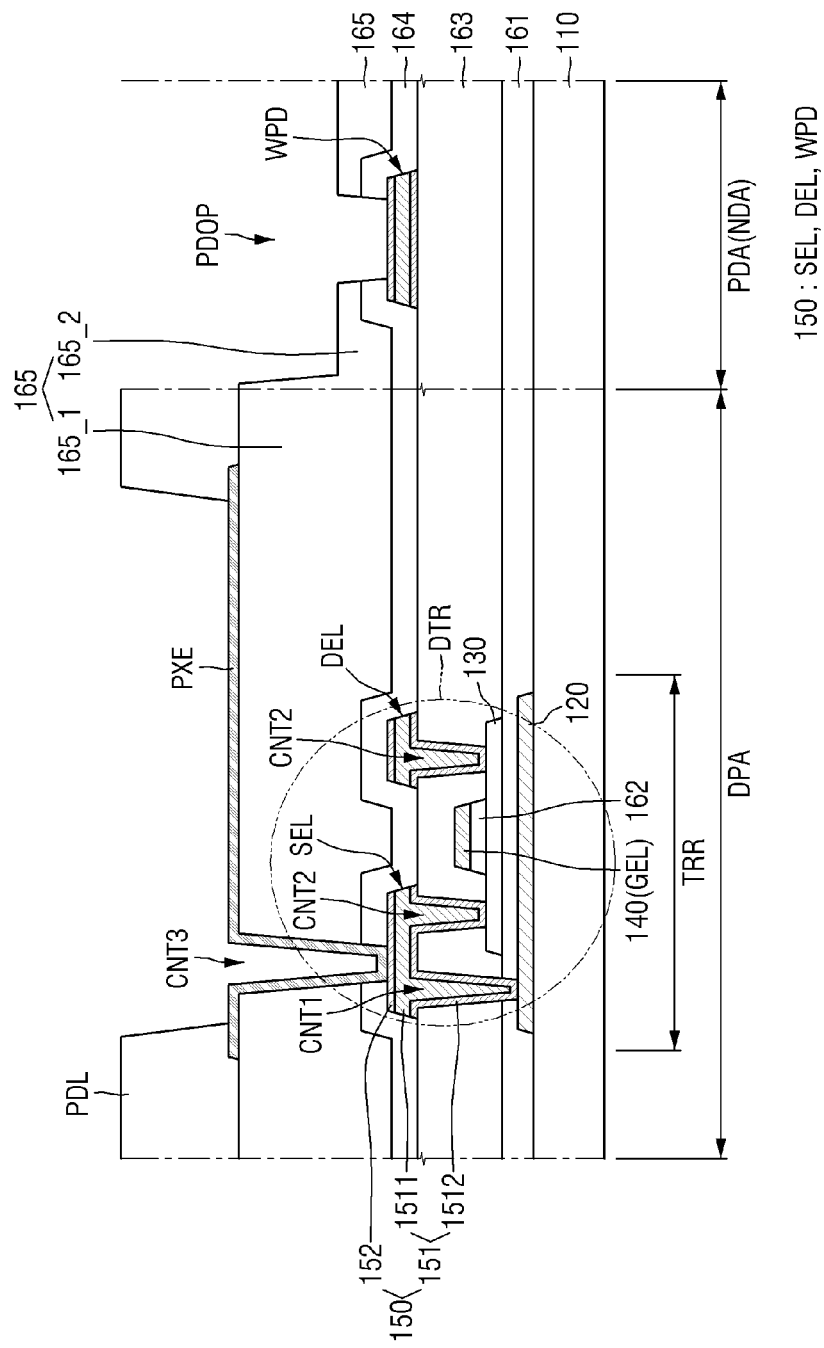
FIG. 5 is a schematic cross-sectional view illustrating the first display substrate of the display device of FIG. 1.

FIG. 5 is a schematic cross-sectional view illustrating the first display substrate of the display device of FIG. 1.

FIG. 5 illustrates part of the display area DPA, by way of example, a transistor region TRR, and part of the non-display area NDA, by way of example, a pad area PDA. The transistor region TRR of FIG. 5 may be a region in which the driving transistor DTR of FIG. 4 may be disposed. FIG. 5 illustrates the circuit layer CCL of the first display substrate 10 mainly and illustrates only part of the first display substrate 10 ranging from the first substrate 110 to the pixel-defining film PDL.

Referring to FIG. 5, the circuit layer CCL may include a semiconductor layer 130, conductive layers, and insulating layers, which may be disposed on the first substrate 110. The semiconductor layer 130 may include an oxide semiconductor. The conductive layers may include a lower metal layer 120, a gate conductive layer 140, a data conductive layer 150, and a pixel electrode PXE. The insulating layers may include a buffer layer 161, a gate insulating film 162, an interlayer insulating film 163, a passivation layer 164, and a via layer 165.

As an example, the lower metal layer 120 may be disposed on the first substrate 110. The lower metal layer 120 may be a light-blocking layer that may protect the semiconductor layer 130 against external light. The lower metal layer 120 may have a patterned shape. The lower metal layer 120 may be disposed in the transistor region TRR. The lower metal layer 120 may be disposed to cover or overlap the semiconductor layer 130, which may be disposed on the lower metal layer 120, from below the semiconductor layer 130. The lower metal layer 120 may be disposed to cover or overlap at least a channel region of the semiconductor layer 130, from below the semiconductor layer 130, or to cover or overlap the entire semiconductor layer 130. The lower metal layer 120 may be electrically connected to a source electrode SEL of the driving transistor DTR through a first contact hole CNT1 to suppress a change in the voltage of the driving transistor DTR. The lower metal layer 120 may be formed as a titanium (Ti)/copper (Cu) double film in which a Ti layer and a copper (Cu) layer may be stacked, but the disclosure is not limited thereto.

The buffer layer 161 may be disposed on the lower metal layer 120. The buffer layer 161 may be disposed to cover or overlap the entire surface of the first substrate 110 where the lower metal layer 120 may be formed. The buffer layer 161 may include silicon nitride, silicon oxide, or silicon oxynitride. In an embodiment, the buffer layer 161 may include a double film of SiNx/SiOx.

The semiconductor layer 130 may be disposed on the buffer layer 161. The semiconductor layer 130 may be disposed in the transistor region TRR and may include the channel of the driving transistor DTR. The semiconductor layer 130 may include an oxide semiconductor. Examples of the oxide semiconductor may include a binary compound (ABx), a tertiary compound (ABxCy), or a quaternary compound (ABxCyDz) containing indium (In), zinc (Zn), gallium (Ga), tin (Sn), titanium (Ti), aluminum (Al), hafnium (Hf), zirconium (Zr), or magnesium (Mg). In an embodiment, the semiconductor layer 130 may include indium gallium zinc oxide (IGZO).

The gate insulating film 162 may be disposed on the semiconductor layer 130. The gate insulating film 162 may be formed into the same or similar pattern as the gate conductive layer 140. The gate insulating film 162, which may be disposed in the transistor region TRR, may be disposed on the semiconductor layer 130. The sides of the gate insulating film 162 may be generally aligned with the sides of the gate conductive layer 140, but the disclosure is not limited thereto. The gate insulating film 162 may include a silicon compound or a metal oxide. For example, the gate insulating film 162 may include silicon oxide, silicon nitride, silicon oxynitride, aluminum oxide, tantalum oxide, hafnium oxide, zirconium oxide, or titanium oxide. In an embodiment, the gate insulating film 162 may include a SiOx film.

The gate conductive layer 140 may be disposed on the gate insulating film 162. The gate conductive layer 140 may include a gate electrode GEL of the driving transistor DTR. The gate conductive layer 140 may include the first electrode (or the lower electrode) of a capacitor in a capacitor region, a scan line SCL, and a sensing signal line SSL. The gate conductive layer 140 may not be formed or disposed in the pad area PDA, but the disclosure is not limited thereto.

The gate conductive layer 140 may be formed as a single-layer film, but may be formed as a multilayer film. In an embodiment, the gate conductive layer 140 may include a gate main metal layer and a gate base layer, which may be disposed below the gate main metal layer. The gate main metal layer and the gate base layer may both include a conductive material. No insulating layer may be interposed or disposed between the films of the gate conductive layer 140 that may overlap one another in the thickness direction. The gate main metal layer and the gate base layer may be patterned by a single mask process.

The gate base layer may be disposed below the gate main metal layer to improve a film forming characteristic such as the adhesiveness of the gate main metal layer or to prevent reactive materials from entering the gate main metal layer from the lower gate insulating film 162, which may be disposed below the gate conductive layer 140. The gate base layer may prevent the material (for example, copper (Cu)) of the gate main metal layer from diffusing into the underlying layers. The gate base layer may include a material such as titanium (Ti), tantalum (Ta), calcium (Ca), chromium (Cr), magnesium (Mg), or nickel (Ni), but the disclosure is not limited thereto.

The gate main metal layer may mainly transmit signals and may include a low-resistance material. The gate main metal layer may be thicker than the gate base layer and may include a material of a lower resistance than the gate base layer. The gate main metal layer may include a material such as copper (Cu), molybdenum (Mo), aluminum (Al), or silver (Ag), but the disclosure is not limited thereto.

The interlayer insulating film 163 may be disposed on the gate conductive layer 140. The interlayer insulating film 163 may be disposed on the gate conductive layer 140, on part of the semiconductor layer 130 exposed by the gate conductive layer 140, and on part of the buffer layer 161 exposed by the gate conductive layer 140 and the semiconductor layer 130. The interlayer insulating film 163 may include an inorganic insulating material such as silicon oxide, silicon nitride, silicon oxynitride, hafnium oxide, aluminum oxide, titanium oxide, tantalum oxide, or zinc oxide. In an embodiment, the interlayer insulating film 163 may include SiON.

For convenience, the top surface of the interlayer insulating film 163 is illustrated as being flat in the display area DPA. Alternatively, the interlayer insulating film 163, which may include an inorganic material, may have a surface shape that may reflect any height differences therebelow. The thickness of each part of the interlayer insulating film 163 may be measured from the same flat reference surface with no height differences thereon (for example, the top surface of the buffer layer 161).

The data conductive layer 150 may be disposed on the interlayer insulating film 163. The data conductive layer 150 may include the source electrode SEL and a drain electrode DEL of the driving transistor DTR in the transistor region TRR and a wire pad WPD in the pad area PDA. The source electrode SEL and the drain electrode DEL may be electrically connected to the semiconductor layer 130 through second contact holes CNT2, which may penetrate the interlayer insulating film 163. The source electrode SEL may be electrically connected to the lower metal layer 120 through the first contact hole CNT1, which may penetrate the interlayer insulating film 163 and the buffer layer 161. The data conductive layer 150 may include the second electrode (or the upper electrode) of the capacitor in the capacitor region, a data line DTL, a reference voltage line RVL, and the first power supply line ELVDL.

The data conductive layer 150 may include a data conductive metal layer 151 and a data capping layer 152, which may be sequentially stacked. The data capping layer 152 may be disposed on the data conductive metal layer 151. The data conductive metal layer 151 may be formed as a single-layer film, but may be formed as a multilayer film. In an embodiment, the data conductive metal layer 151 may include a data main metal layer 1511 and a data base layer 1512, which may be disposed below the data main metal layer 1511.

The data base layer 1512, the data main metal layer 1511, and the data capping layer 152 may all include a conductive material. The data base layer 1512, the data main metal layer 1511, and the data capping layer 152 may be patterned by a single mask process. In an embodiment, the sides of an upper layer of the data conductive layer 150 may not protrude outwardly beyond the sides of a lower layer of the data conductive layer 150. In an embodiment, the sides of each of the layers of the data conductive layer 150 (for example, the sides of each of the data base layer 1512, the data main metal layer 1511, and the data capping layer 152) may all be aligned. For example, the data conductive layer 150 may not have a tip structure in which an upper layer of the data conductive layer 150 protrudes. The sides of an upper layer of the data conductive layer 150 may be aligned with, or positioned on the inside of, the sides of a lower layer of the data conductive layer 150. For example, the sides of the data capping layer 152, which may be disposed in an upper part of the data conductive layer 150, may be aligned with, or positioned on the inside of the sides of the data main metal layer 1511, which may be disposed in a lower part of the data conductive layer 150. No insulating layers may be interposed or disposed between the layers of the data conductive layer 150 that may overlap one another in the thickness direction. A process of forming the stack structure of the data conductive layer 150 will be described later.

The data base layer 1512 may improve a film forming characteristic such as the adhesiveness of the data main metal layer 1511 or to prevent reactive materials from entering the data main metal layer 1511 from the interlayer insulating film 163, which may be disposed below the data conductive layer 150. The data base layer 1512 may prevent the material (for example, copper (Cu)) of the data main metal layer 1511 from diffusing into the underlying layers. The data base layer 1512 may include a material such as Ti, Ta, Ca, Cr, Mg, or Ni, but the disclosure is not limited thereto.

The data main metal layer 1511 may include a low-resistance material. The data main metal layer 1511 may be thicker than the data base layer 1512 and the data capping layer 152 and may include a material of a lower resistance than the data base layer 1512 and the data capping layer 152. The data main metal layer 1511 may include a material such as copper (Cu), aluminum (Al), silver (Ag), or molybdenum (Mo), but the disclosure is not limited thereto.

The data capping layer 152 may cover or overlap and may protect the data main metal layer 1511, from above the data main metal layer 1511. The data capping layer 152 may protect the data main metal layer 1511 against etchants or other chemicals used to form layers on the data conductive layer 150. The data capping layer 152 may prevent the material (for example, copper (Cu)) of the data main metal layer 1511 from diffusing into layers disposed on the data conductive layer 150. The data capping layer 152 may be in direct contact with the data main metal layer 1511.

The data capping layer 152 may be used as a contact electrode of the wire pad WPD in the pad area PDA. Thus, the data capping layer 152 may include a material for use as the contact electrode of the wire pad WPD. The data capping layer 152 may include a transparent conductive material or a low-reflectance conductive material. The data capping layer 152 may include a transparent conductive material such as ITO, IZO, or ITZO. Alternatively, the data capping layer 152 may include a low-reflectance conductive material such as Ti. For example, the data capping layer 152 may be formed as a single-layer film including an ITO film or a Ti film or may be formed as a multilayer film.

In an embodiment, the data conductive layer 150 may include a data base layer 1512 including Ti, a data main metal layer 1511 including copper (Cu), and a data capping layer 152 including ITO. The data conductive layer 150 may include a triple-layer film of Ti/Cu/ITO, but the disclosure is not limited thereto. Alternatively, the data conductive layer 150 may have a stack of Ti/Cu/IZO or Ti/Cu/Ti.

As already mentioned above, the thickness of the data main metal layer 1511 may be greater than the thicknesses of the data base layer 1512 and the data capping layer 152. In an embodiment where the data conductive layer 150 may be formed as a triple-layer film of Ti/Cu/ITO, the data main metal layer 1511 may be formed to a thickness in a range of about 7000 Å to about 11000 Å, the data base layer 1512 may be formed to a thickness in a range of about 100 Å to about 300 Å, and the data capping layer 152 may be formed to a thickness of in a range of about 300 Å to about 500 Å. However, the disclosure is not limited to this embodiment.

Since the data conductive layer 150 may have a structure in which the sides of an upper layer of the data conductive layer 150 may not protrude or extend outwardly beyond the sides of a lower layer of the data conductive layer 150, for example, since the data conductive layer 150 does not have a tip structure in which an upper layer of the data conductive layer 150 protrudes, the occurrence of step coverage defects due to the tip structure may be prevented, and as a result, the generation of cracks in the passivation layer 164 due to such step coverage defects may be prevented. Therefore, a circuit layer CCL with high reliability may be provided.

The passivation layer 164 may be disposed on the data conductive layer 150. The passivation layer 164 may be formed or disposed on the entire surface of the display area DPA and may not be formed at least in part of the non-display area NDA. The passivation layer 164 may not be disposed at least on part of the wire pad WPD in the pad area PDA.

The passivation layer 164 may cover or overlap and may protect the data conductive layer 150. The passivation layer 164 may include an inorganic insulating material such as silicon oxide, silicon nitride, silicon oxynitride, hafnium oxide, aluminum oxide, titanium oxide, tantalum oxide, or zinc oxide.

The via layer 165 may be disposed on the passivation layer 164. The via layer 165 may cover or overlap the top surface of the passivation layer 164. The via layer 165 may planarize any height difference caused by the driving transistor DTR in the display area DPA. The via layer 165 may include an organic insulating material such as an acrylic resin, an epoxy resin, a phenolic resin, a polyamide resin, a polyimide resin, an unsaturated polyester resin, a polyphenylene resin, a polyphenylene sulfide resin, or BCB. The via layer 165 may include a photosensitive material, but the disclosure is not limited thereto. In an embodiment, the via layer 165 may include polyimide.

The via layer 165 may have different heights in different regions. The via layer 165 may include a first region 165_1 having a first height and a second region 165_2 having a second height, which may be smaller than the first height. The via layer 165 may have a generally flat surface regardless of the shape and the presence of a pattern disposed below the via layer 165. The via layer 165 may have a height difference at the boundary between the first and second regions 165_1 and 165_2.

The first region 165_1 of the via layer 165 may be disposed in the display area DPA. The second region 165_2 of the via layer 165 may be disposed in the pad area PDA. Since the via layer 165 may have a relatively small height in the pad area PDA, an external device may be smoothly mounted on the wire pad WPD.

The via layer 165 may form a pad opening PDOP, which may expose at least part of the wire pad WPD of the data conductive layer 150 in the pad area PDA, together with the passivation layer 164, which may be disposed below the via layer 165. In the pad area PDA, the sides of the passivation layer 164 may be aligned with the sides of the via layer 165, which may form the inner sidewalls of the pad opening PDOP together with the sides of the passivation layer 164, but the disclosure is not limited thereto. The inner sidewalls of the pad opening PDOP may be disposed to overlap the wire pad WPD of the data conductive layer 150. The passivation layer 164 and the via layer 165 may be formed by a single mask process.

The pixel electrode PXE may be disposed on the via layer 165. The material of the pixel electrode PXE may be as already described above with reference to FIG. 2. In an embodiment, the pixel electrode PXE may include a triple-layer film of ITO/Ag/ITO.

The pixel electrode PXE may be disposed in the display area DPA, but not in the non-display area NDA. The pixel electrode PXE may overlap the transistor region TRR and the capacitor of the display area DPA, but the disclosure is not limited thereto. The pixel electrode PXE may be electrically connected to the source electrode SEL of the driving transistor DTR through a third contact hole CNT3, which may penetrate the via layer 165 and the passivation layer 164.

The pixel-defining film PDL may be disposed on the pixel electrode PXE. The material of the pixel-defining film PDL may be as already described above with reference to FIG. 2. In an embodiment, the pixel-defining film PDL may include polyimide.

The pixel-defining film PDL may be disposed in the display area DPA, but not in the non-display area NDA. The pixel-defining film PDL may be disposed to overlap the edges of the pixel electrode PXE. The pixel-defining film PDL may be disposed on parts of the via layer 165 where the pixel electrode PXE may not be formed or disposed.

A method of fabricating a semiconductor device according to embodiments will hereinafter be described.

FIGS. 6 through 16 are schematic cross-sectional views illustrating a method of fabricating the display device of FIG. 5. FIGS. 11 through 14 are enlarged schematic cross-sectional views illustrating a method of fabricating the data conductive layer of FIG. 5.

Figure 6:
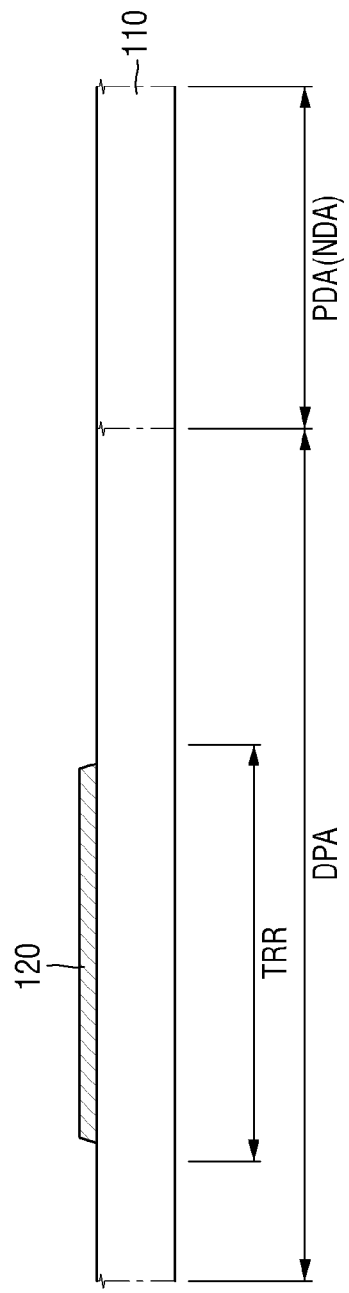
FIGS. 6 through 10 are schematic cross-sectional views illustrating a method of fabricating the display device of FIG. 5.

Referring to FIG. 6, the lower metal layer 120, which may be patterned, may be formed or disposed on the first substrate 110. The lower metal layer 120 may be formed by a mask process. For example, a material layer for the lower metal layer 120 may be deposited on the entire surface of the first substrate 110 and may then be patterned into the lower metal layer 120 of FIG. 6 through photolithography.

Figure 7:
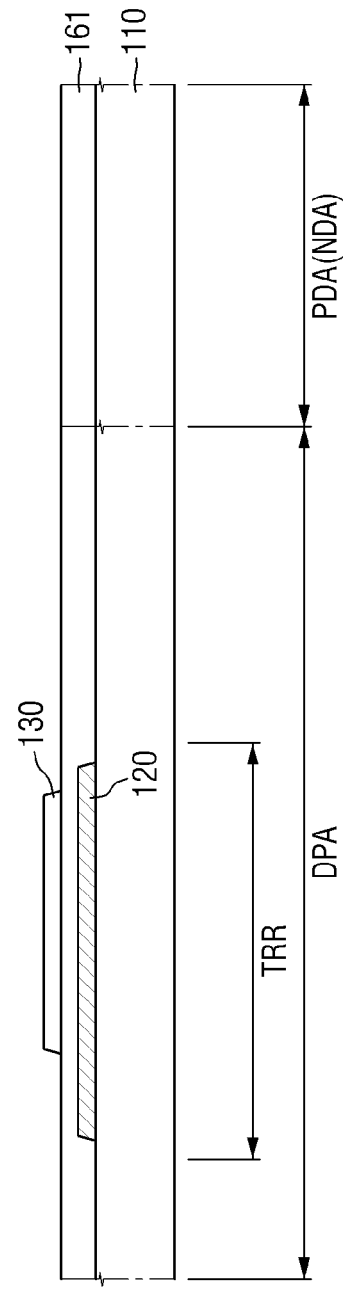

Thereafter, referring to FIG. 7, the buffer layer 161 may be formed or disposed on the entire surface of the first substrate 110 where the lower metal layer 120 may be formed or disposed. Thereafter, the semiconductor layer 130 may be formed or disposed on the buffer layer 161. The semiconductor layer 130 may be formed by a mask process. For example, an oxide semiconductor may be deposited on the entire surface of the buffer layer 161 and may then be patterned into the semiconductor layer 130 of FIG. 7 through photolithography.

Figure 8:
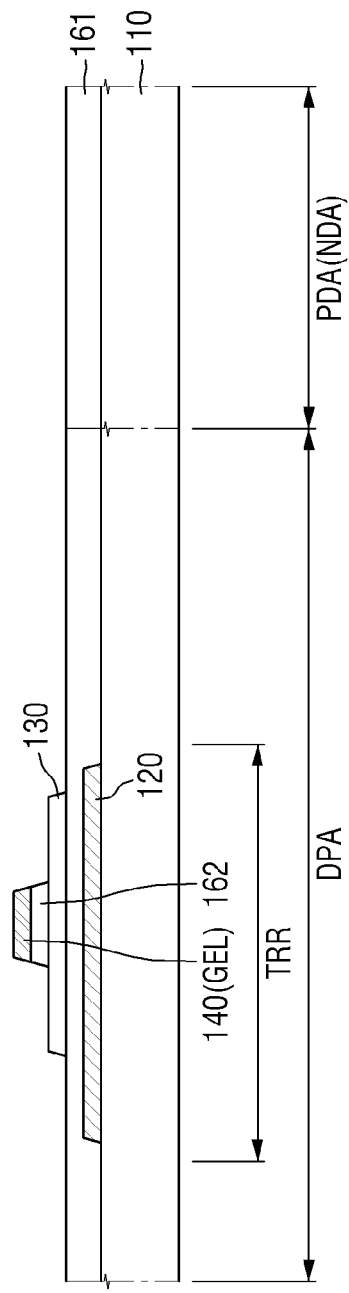

Thereafter, referring to FIG. 8, the gate insulating film 162 and the gate conductive layer 140, which may be patterned, may be formed or disposed on the buffer layer 161 where the semiconductor layer 130 may be formed or disposed. The gate insulating film 162 and the gate conductive layer 140 may be formed by a single mask process.

As an example, a material layer for the gate insulating film 162 may be deposited on the entire surface of the buffer layer 161 where the semiconductor layer 130 may be formed or disposed. Thereafter, a material layer for a gate conductive metal layer and a material layer for a gate capping layer may be sequentially deposited on the material layer for the gate insulating film 162. Thereafter, a photoresist layer may be applied on the material layer for the gate capping layer and may be subjected to exposure and development, thereby forming a photoresist pattern. Thereafter, the material layer for the gate capping layer, the material layer for the gate conductive metal layer, and the material layer for the gate insulating film 162 may be sequentially etched using the photoresist pattern as an etching mask. Thereafter, the photoresist pattern may be removed by a strip or ashing process. The photoresist pattern may be used as an etching mask even in the patterning of the gate insulating film 162. Alternatively, a patterned upper layer may be used as a hard mask that may etch the layer(s) disposed therebelow. The photoresist pattern may be used as an etching mask, together with the hard mask. Alternatively, a hard mask may be formed, the photoresist pattern may be removed, and the layer(s) below the hard mask may be etched using the hard mask as an etching mask.

Figure 9:
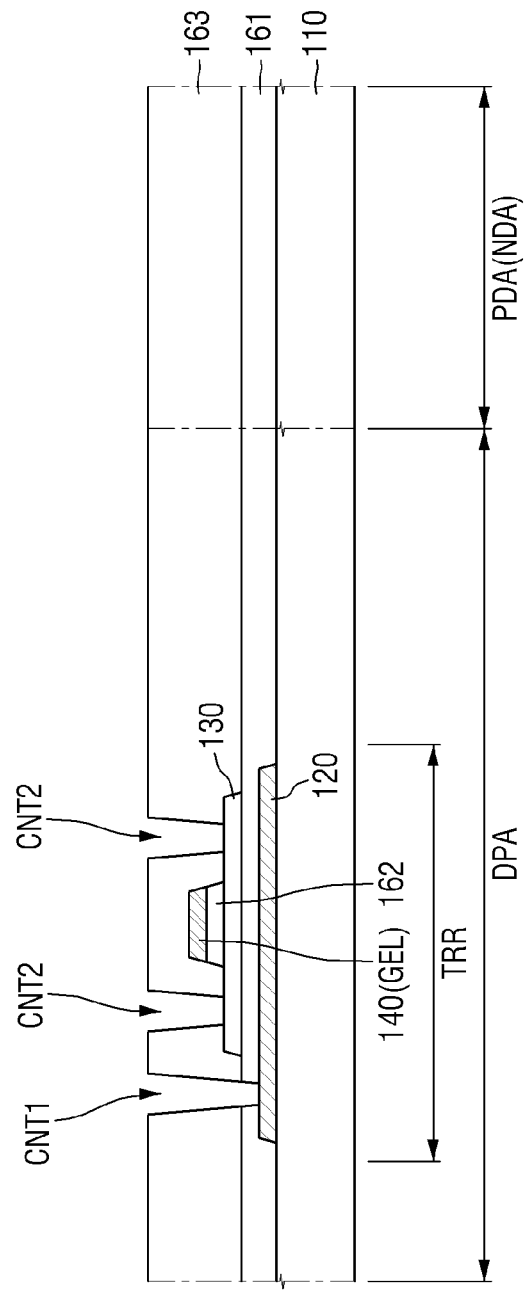

Thereafter, referring to FIG. 9, the interlayer insulating film 163 may be deposited on the buffer layer 161 where the gate conductive layer 140 may be formed or disposed, the first contact hole CNT1, which may expose part of the lower metal layer 120, and the second contact holes CNT2, which may expose part of the semiconductor layer 130 (for example, the source and drain regions of the semiconductor layer 130). The first contact hole CNT1 and the second contact holes CNT2 may be formed using the same or similar mask. For example, an insulating layer that may form the interlayer insulating film 163 may be deposited on the entire surface of the buffer layer 161 where the gate conductive layer 140 may be formed. Thereafter, a photoresist pattern that may expose parts of the lower metal layer 120 and the semiconductor layer 130 may be formed or disposed on the insulating layer that may form the interlayer insulating film 163, and the insulating layer that may form the interlayer insulating film 163 may be etched using the photoresist pattern as an etching mask, thereby forming the first contact hole CNT1 and the second contact holes CNT2.

However, the disclosure is not limited to this. For example, alternatively, the first contact hole CNT1 and the second contact holes CNT2 may be sequentially formed using different masks. For example, a first photoresist pattern that may expose part of the lower metal layer 120 may be formed on the insulating layer that may form the interlayer insulating film 163, and the buffer layer 161 and the insulating layer that may form the interlayer insulating film 163 may be etched using the first photoresist pattern as an etching mask, thereby forming the first contact hole CNT1, which may expose part of the lower metal layer 120. Thereafter, the first photoresist pattern may be removed, and a second photoresist pattern that may expose part of the semiconductor layer 130 (for example, the source and drain regions of the semiconductor layer 130) may be formed on the insulating layer that may form the interlayer insulating film 163, and the insulating layer that may form the interlayer insulating film 163 may be etched using the second photoresist pattern as an etching mask, thereby forming the second contact holes CNT2.

Figure 10:
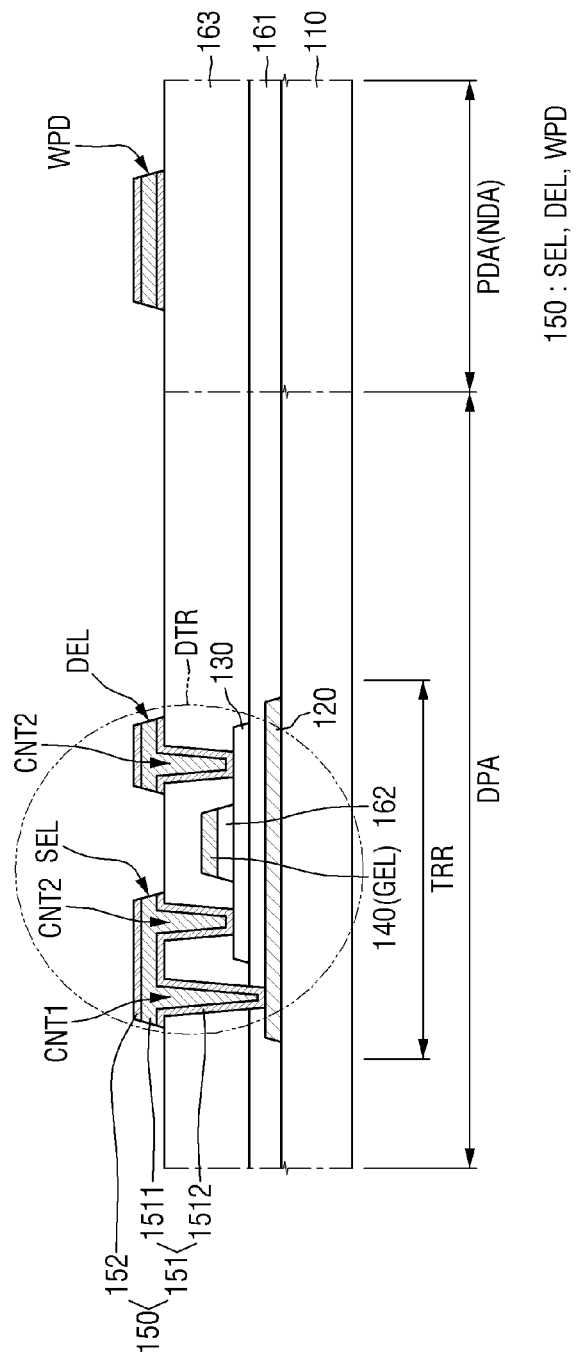

Thereafter, referring to FIG. 10, the data conductive layer 150, which may be patterned, may be formed on the interlayer insulating film 163. The data conductive layer 150 may be formed by a single mask process. The data conductive layer 150 may include the source electrode SEL and the drain electrode DEL, which may be disposed in the transistor region TRR of the display area DPA, the first (or lower) electrode (not illustrated) of the capacitor (not illustrated), which may be disposed in the capacitor region (not illustrated), and the wire pad WPD, which may be disposed in the pad area PDA of the non-display area NDA. The data conductive layer 150 may include the second (or upper) electrode (not illustrated) of the capacitor, which may be disposed in the capacitor region, the data line DTL, the reference voltage line RVL, and the first power supply line ELVDL.

It will hereinafter be described how to form the data conductive layer 150, which may be patterned, on the interlayer insulating film 163 with reference to FIGS. 10 through 14. FIGS. 10 through 14 illustrate only the data conductive layer 150 in the pad area PDA, but the data conductive layer 150 may be formed in the same or similar manner in the display area DPA as in the pad area PDA.

The data conductive metal layer 151 and the data capping layer 152 of the data conductive layer 150 may be formed using the same or similar mask. In an embodiment, the formation of the data conductive layer 150, which may be patterned, may include performing a first etching step of etching a material layer for the data capping layer 152 with a first etchant, performing a second etching step of etching both a material layer for the data conductive metal layer 151 and a material layer for the data capping layer 152 with a second etchant, and performing a third etching step of etching the material layer for the data capping layer 152 with a third etchant.

Figure 11:
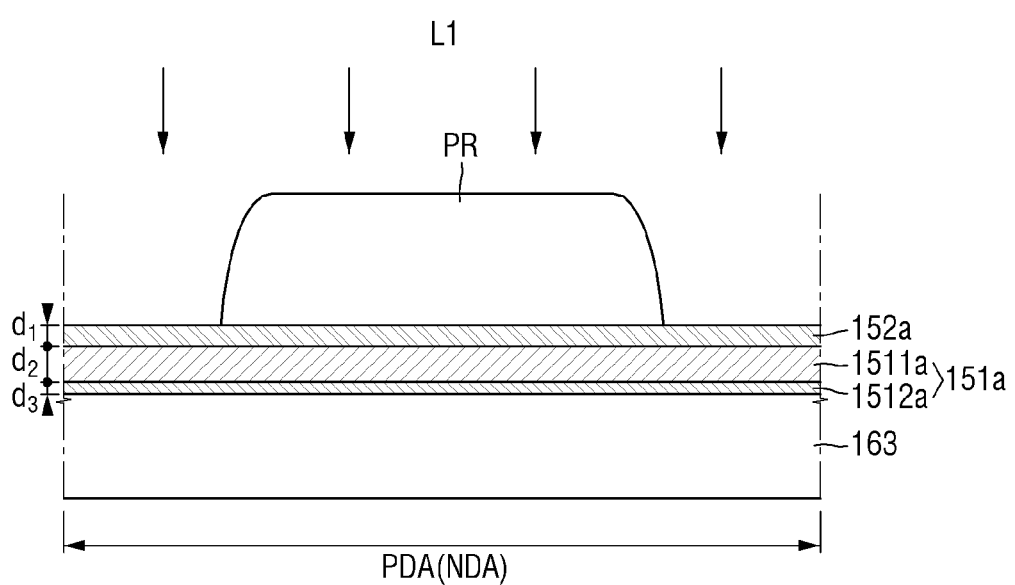
FIGS. 11 through 14 are enlarged schematic cross-sectional views illustrating a method of fabricating a data conductive layer of FIG. 5.

First, referring to FIGS. 10 and 11, a data conductive material layer in which a material layer 151a that may form the data conductive metal layer 151 and a material layer 152a that may form the data capping layer 152 may be sequentially stacked is prepared on the interlayer insulating film 163. As an example, a material layer 1512a that may form the data base layer 1512, a material layer 1511a that may form the data main metal layer 1511, and the material layer 152a may be sequentially deposited on the entire surface of the interlayer insulating film 163. During the deposition of the material layers 1512a, 1511a, 152a, the material layers 1512a and 1511a may be deposited even on the inside of the first contact hole CNT1 and the second contact holes CNT2 and may thus be electrically connected to the lower metal layer 120 and the semiconductor layer 130, respectively.

The thicknesses of the material layers 1512a, 1511a, and 152a, which may be sequentially stacked on the interlayer insulating film 163, may differ. As an example, a thickness $d_2$ of the material layer 1511a and a thickness $d_3$ of the material layer 1512a may be greater than a thickness $d_1$ of the material layer 152a. For example, the thickness $d_1$ of the material layer 152a may be in a range of about 300 Å to about 500 Å, the thickness $d_2$ of the material layer 1511a may be in a range of about 7000 Å to about 11000 Å, and the thickness $d_3$ of the material layer 1512a may be in a range of about 100 Å to about 300 Å. However, the disclosure is not limited to this example. In an embodiment, the material layer 1511a may include Cu, the material layer 152a may include at least one of an ITO film, a Ti film, an IZO film, or an ITZO film, and the material layer 1512a may include Ti.

Thereafter, a photoresist pattern PR, which may be used as an etching mask, may be formed or disposed on the material layer 152a. The photoresist pattern PR may be used as an etching mask that may etch the material layers 1512a, 1511a, and 152a. The photoresist pattern PR, which may be patterned, may be formed by applying a photoresist layer and subjecting the photoresist layer to exposure and development. The photoresist pattern PR may have a similar pattern shape to the data conductive layer 150 to be formed. As an example, the photoresist pattern PR may be patterned to overlap the wire pad WPD to be formed in the pad area PDA of the non-display area NDA and with the source electrode SEL and the drain electrode DEL to be formed in the transistor region TRR of the display area DPA.

Thereafter, the material layer 152a may be etched using the photoresist pattern PR as an etching mask. The material layer 152a may be wet-etched using a first etchant L1. As a result, part of the material layer 152a exposed by the photoresist pattern PR may be etched away so that part of the material layer 151a or 1511a that does not overlap the photoresist pattern PR may be exposed.

In an embodiment, in a case where the material layers 1512a, 1511a, and 152a are stacks of Ti/Cu/ITO, the first etchant L1 may have a faster etching speed for the material layer 152a than for the material layer 1511a. Alternatively, the first etchant L1 may include an etchant composition that may not etch the material layer 1511a. For example, the first etchant L1 may include an etchant composition that may etch ITO, but not Cu and Ti.

In an embodiment, in a case where the material layers 1512a, 1511a, and 152a are stacks of Ti/Cu/Ti, the first etchant L1 may have a lower etching speed for the material layer 152a than for the material layer 1511a. For example, the first etchant L1 may include an etchant composition that may etch Ti and Cu and may have a lower etching speed for a material layer including Ti, for example, the material layer 152a, than for a material layer including Cu, for example, the material layer 1511a.

The term "over-etch", as used herein, may mean that etching is continued for more than the reference amount of time that it generally takes to reach an etching endpoint, which is the point when a target material layer is removed to expose another material layer. The reference amount of time for the target material layer may be indicated by Equation (1):

$$\text{Reference Amount of Time} = \frac{\text{Thickness of Target Material Layer}}{\text{Etching Speed}} \quad (1)$$

The degree to which the target material layer may be over-etched will hereinafter be referred to as the over-etch rate of the target material layer, and the over-etch rate of the target material layer is defined as the ratio of the duration of the etching of the target material layer that runs over the reference amount of time for the target material layer to the reference amount of time for the target material layer. For example, if the target material layer has a thickness of about 200 Å and is etched at an etching speed of about 10 Å/s, the reference amount of time for the target material layer may be about 10 seconds. In this example, if the duration of the etching of the target material layer is about 10 seconds, the over-etch rate of the target material layer may be about 0%. If the duration of the etching of the target material layer is about 20 seconds, the over-etch rate of the target material layer may be about 100%.

Referring again to FIGS. 10 and 11, in order to prevent the material layer 152a from being left in areas that may not overlap the photoresist pattern PR after the etching of the material layer 152a, which may be formed or disposed on the interlayer insulating film 163, the material layer 152a may be over-etched using the first etchant L1. In a non-limiting embodiment, the material layer 152a may be over-etched using the first etchant L1 at an over-etch rate in a range of about 100% to about 200%. In an embodiment, the reference amount of time for determining the over-etch rate of the material layer 152a may be determined based on the thickness $d_1$ of the material layer 152a.

Figure 12:
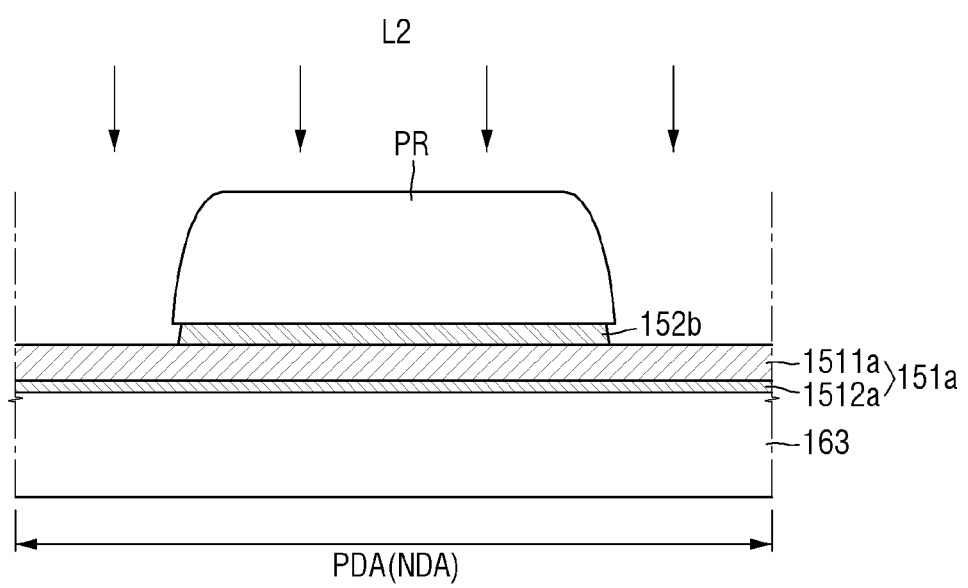

As a result of the etching of the material layer 152a, the material layer 152a may be etched not only in the areas that may not overlap the photoresist pattern PR, but also in part in an area that may overlap the photoresist pattern PR, and as a result, a first data capping pattern layer 152b of FIG. 12 may be formed. The sides of the first data capping pattern layer 152b, which may be obtained by over-etching the material layer 152a, may be positioned on the inside of the sidewalls of the photoresist pattern PR.

Thereafter, referring to FIGS. 10 and 12, the material layer 151a and the first data capping pattern layer 152b may both be etched at the same time using the photoresist pattern PR as an etching mask. The material layers 1512a and 1511a and the first data capping pattern layer 152b may be wet-etched using a second etchant L2.

The second etchant L2 may have different etching speeds for the first data capping pattern layer 152b and the material layer 1511a. In an embodiment, the etching speed of the second etchant L2 for the first data capping pattern layer 152b may be lower than the etching speed of the second etchant L2 for the material layer 1511a. In an embodiment, in a case where the material layer 1512a, 1511a, and 152a are stacks of Ti/Cu/ITO, the etching speed of the second etchant L2 for an ITO film may be lower than the etching speed of the second etchant L2 for a Cu film. In an embodiment, in a case where the material layer 1512a, 1511a, and 152a are stacks of Ti/Cu/Ti, the etching speed of the second etchant L2 for a Ti film may be lower than the etching speed of the second etchant L2 for a Cu film.

Figure 13:
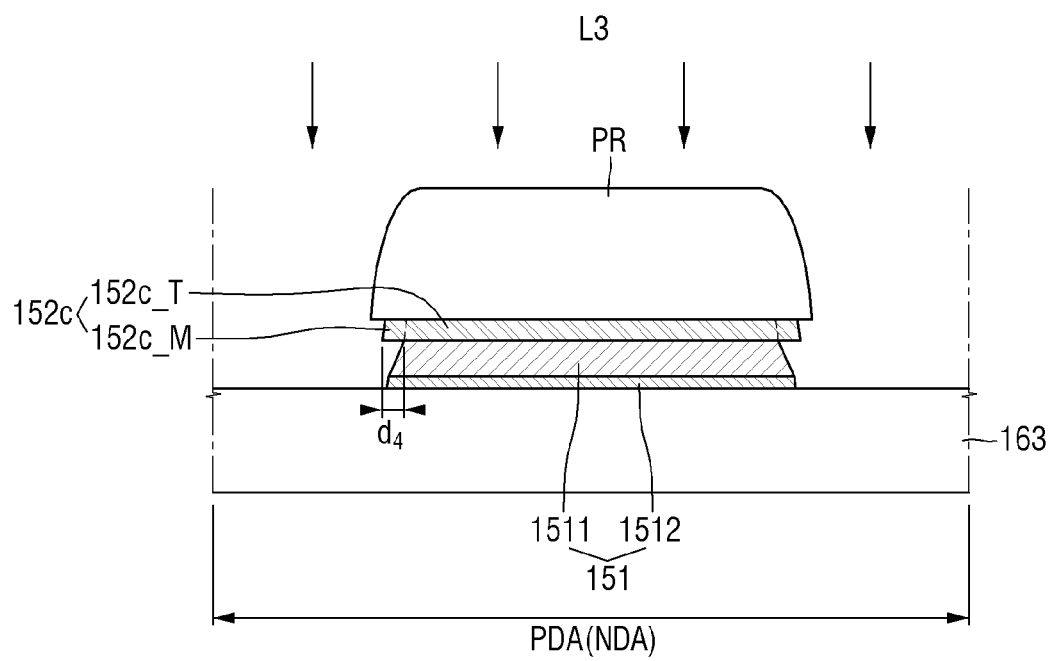

Due to the difference between the etching speed of the second etchant L2 for the first data capping pattern layer 152b and the etching speed of the second etchant L2 for the material layer 1511a, the degree to which the first data capping pattern layer 152b may be etched may differ from the degree to which the material layer 1511a may be etched. As a result, the first data capping pattern layer 152b and the material layer 1511a may be formed into a second data capping pattern layer 152c and a data main metal layer 1511, respectively, of FIG. 13. Referring to FIG. 13, the second data capping pattern layer 152c may be formed to protrude beyond the data main metal layer 1511.

In order to prevent the material layer 151a from being left in areas that may not overlap the first data capping pattern layer 152b during the etching of both the material layer 151a and the first data capping pattern layer 152b, which may be formed or disposed on the interlayer insulating film 163, the material layer 1511a may be over-etched using the second etchant L2. However, if the material layer 1511 is excessively over-etched, an upper layer of the data conductive layer 150 may protrude excessively beyond a lower layer of the data conductive layer 150 to the difference between the etching speed of the second etchant L2 for the first data capping pattern layer 152b and the etching speed of the second etchant L2 for the material layer 1511a. Thus, the over-etch rate of the material layer 151a and the first data capping pattern layer 152b needs to be appropriately determined. In a non-limiting embodiment, during the etching of the material layer 151a and the first data capping pattern layer 152b, the material layer 1511a may be over-etched using the second etchant L2 at an over-etch rate of about 50% or lower. In an embodiment, the reference amount of time for determining the over-etch rate of the material layer 1511a may be determined based on the thickness $d_2$ of the material layer 1511a.

As a result of the etching of the material layer 151a and the first data capping pattern layer 152b, the first data capping pattern layer 152b may be partially etched, only on the edges thereof, so that a second data capping pattern layer 152c of FIG. 13 may be formed, and part of the material layer 151a that may not overlap the first data capping pattern layer 152b may be etched so that a data conductive layer 151 of FIG. 13 may be formed. Referring to FIG. 13, the sides of the second data capping pattern layer 152c may be positioned on the inside of the sidewalls of the photoresist pattern PR and may protrude outwardly beyond the data conductive metal layer 151.

Before the etching of the material layer 151a and the first data capping pattern layer 152b, the material layer 152a may be over-etched using the first etchant L1 not to be left on the part of the material layer 151a that may not overlap the photoresist pattern PR. As a result, the material layer 151a may be prevented from being over-etched and damaged in some or a predetermined number of areas during the etching of the material layer 151a and the first data capping pattern layer 152b. As an example, if the material layers for the data conductive layer 151 may all be etched together using the second etchant L2 without etching the material layer 152a using the first etchant L1, the material layer 152a may need to be over-etched in all areas to be sufficiently etched because the etching speed of the second etchant L2 for the material layer 152a, which may include Ti or ITO, may be lower than the etching speed of the second etchant L2 for the material layer 151a, which may include Cu. Then, the material layer 151a may be too much over-etched in some or a predetermined number of areas. However, if the etching of the material layer 152a using the first etchant L1 is performed first, the material layer 152a may be sufficiently etched in advance before the etching of the material layers for the data conductive layer 151 with the second etchant L2, and thus, the over-etch rate of the material layers for the data conductive layer 151 may be lowered during the etching of all the material layers for the data conductive layer 151 with the second etchant L2. As a result, the material layer 151a may be prevented from being damaged in some or a predetermined number of areas.

Thereafter, referring to FIGS. 10 and 13, the second data capping pattern layer 152c may be etched using the photoresist pattern PR as an etching mask.

Meanwhile, the second data capping pattern layer 152c may include a first region 152c_T overlapping the data main metal layer 1511 and a second region 152c_M not overlapping the data main metal layer 1511. The first region 152c_T of the second data capping pattern layer 152c may correspond to the data capping layer 152, and the second region 152c_M of the second data capping pattern layer 152c may correspond to a tip structure that protrudes outwardly beyond the data main metal layer 1511.

The second data capping pattern layer 152c may be wet-etched using a third etchant L3. During the etching of the second data capping pattern layer 152c, the second region 152c_M of the second data capping pattern layer 152c may be etched and removed by the third etchant L3. For example, the etching of the second data capping pattern layer 152c may be the step of removing a tip generated in the process of etching all the material layers for the data conductive layer 151 using the second etchant L2.

In order to remove the second region 152c_M of the second data capping layer 152c, but the first region 152c_T of the second data capping layer 152c, during the etching of the second data capping layer 152c, the duration of the etching of the second data capping pattern layer 152c may be appropriately determined. In an embodiment, during the etching of the second data capping pattern layer 152c using the third etchant L3, the second data capping pattern layer 152c may not be over-etched.

In an embodiment, the second data capping pattern layer 152c may be over-etched at an over-etch rate of about 10% or lower. In an embodiment, the reference amount of time for determining the over-etch rate of the second data capping pattern layer 152c may be determined based on the thickness $d_4$ of the second region 152c_M of the second data capping pattern layer 152c. The thickness $d_4$ of the second region 152c_M of the second data capping pattern layer 152c may be the distance from a side of the data main metal layer 1511 to a corresponding sidewall of the second data capping pattern layer 152c that protrudes outwardly beyond the data main metal layer 1511.

In an embodiment, the third etchant L3 may include the same or similar etchant composition as the first etchant L1. In an embodiment, the duration of etching using the third etchant L3 may be considerably shorter than the duration of etching using the first etchant L1 in order to selectively remove the second region 152c_M of the second data capping pattern layer 152c with the third etchant L3.

In an embodiment, the third etchant L3 may include a different etchant composition from the first etchant L1. In an embodiment, in order to easily control the duration of etching for selectively removing the second region 152c_M of the second data capping pattern layer 152c, the etching speed of the third etchant L3 for the material layer 152a may be lower than the etching speed of the first etchant L1 for the material layer 152a, but the disclosure is not limited thereto.

Figure 14:
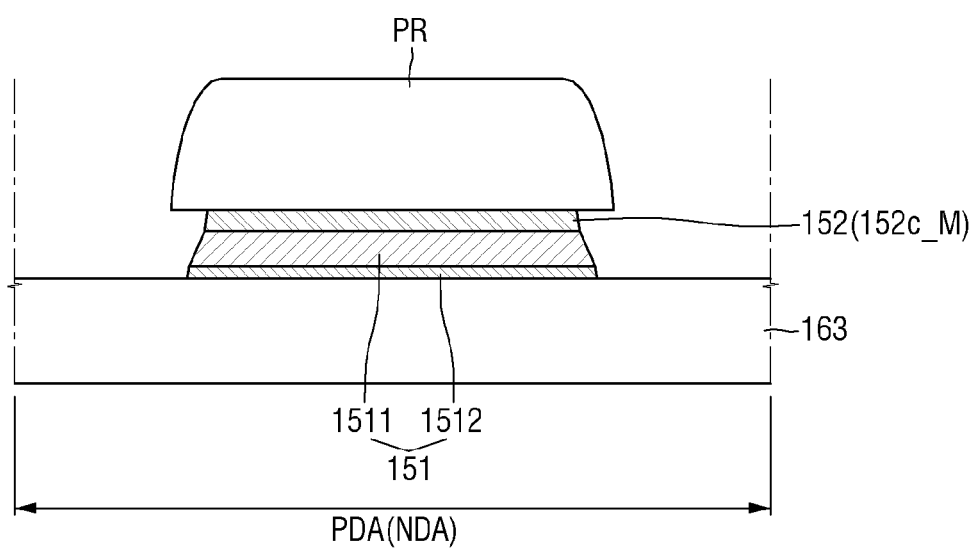

Referring to FIG. 14, as a result of the etching of the second data capping pattern layer 152c, the second region 152c_M of the second data capping pattern layer 152c may be removed so that the data capping layer 152 may be formed. The data capping layer 152 may correspond to the first region 152c_T of the second data capping pattern layer 152c.

By etching a tip structure, such as the second region 152c_M of the second data capping pattern layer 152c, using the third etchant L3, the generation of cracks near the second region 152c_M of the second data capping pattern layer 152c during the deposition of the passivation layer 164 may be prevented, and as a result, the reliability of the circuit layer CCL may be improved.

Thereafter, the photoresist pattern PR that may remain on the data capping layer 152 may be removed by an ashing or strip process, thereby forming the data conductive layer 150 of FIG. 10.

Figure 15:
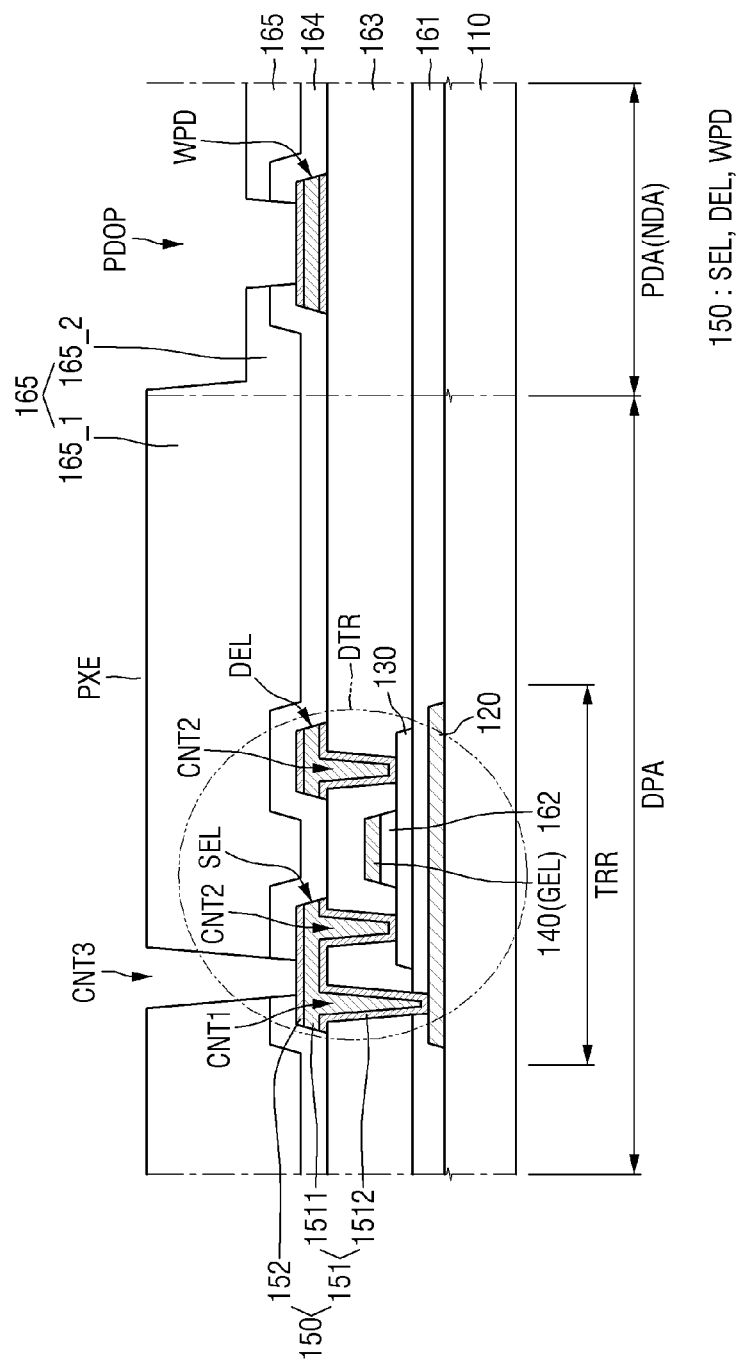
FIGS. 15 and 16 are schematic cross-sectional views illustrating a method of fabricating the display device of FIG. 5

Thereafter, referring to FIG. 15, the passivation layer 164 and the via layer 165 may be sequentially deposited on the interlayer insulating film 163 where the data conductive layer 150 may be formed, and the third contact hole CNT3, which may expose part of the data conductive layer 150 in the transistor region TRR, for example, the source electrode SEL, and the pad opening PDOP, which may expose part of the data conductive layer 150 in the pad area PDA, for example, the wire pad WPD, may be formed. The passivation layer 164 and the via layer 165 may be formed using the same or similar mask.

The via layer 165 may have a generally flat surface and may have different heights in different regions. For example, the height of the via layer 165 may be smaller in the pad area PDA than in the display area DPA.

For example, the via layer 165 may include an organic material containing a photosensitive material. In this example, the passivation layer 164 and the via layer 165, which may be patterned, may be formed by applying a material layer for the passivation layer 164 and an organic material layer for the via layer 165 and subjecting them to exposure and development to form an opening.

As an example, the material layer for the passivation layer 164 and the organic material layer for the via layer 165 may be deposited on the entire surface of the interlayer insulating film 163 where the data conductive layer 150 may be formed.

Thereafter, a photoresist pattern may be formed by forming a photoresist layer on the organic material layer for the via layer 165 and subjecting the photoresist layer to exposure and development. The photoresist pattern may include a first opening exposing an area that may overlap the source electrode SEL in the transistor region TRR and a second opening exposing the pad area PDA. The first opening may overlap the third contact hole CNT3, and the second opening may overlap the pad opening PDOP.

Thereafter, the passivation layer 164 and the via layer 165 may be etched using, as an etching mask, the photoresist pattern on the organic material layer for the via layer 165. The via layer 165, which may have different heights in different regions, may be formed using a halftone mask or a slit mask. As a result of the etching of the passivation layer 164 and the via layer 165, parts of the passivation layer 164 and the via layer 165 exposed by the first opening may be etched so that the third contact hole CNT3, which may expose the source electrode SEL in the transistor region TRR, may be formed. Parts of the passivation layer 164 and the via layer 165 exposed by the second opening may be etched so that the pad opening PDOP, which may expose the wire pad WPD in the pad area PDA, may be formed. During the etching of the passivation layer 164 and the via layer 165, the data capping layer 152 of the data conductive layer 150 may protect the data conductive metal layer 151, which may be disposed below the data capping layer 152. Thereafter, the photoresist pattern may be removed by a strip or ashing process, thereby forming the passivation layer 164 and the via layer 165 of FIG. 15, which may be patterned.

The third contact hole CNT3 and the pad opening PDOP expose the data conductive layer 150, by way of example, the data capping layer 152 of the data conductive layer 150. The third contact hole CNT3 may expose the data capping layer 152 in the source electrode SEL in the transistor region TRR. Similarly, the pad opening PDOP may expose the data capping layer 152 in the pad area PDA. The sides of the via layer 165 that may form the pad opening PDOP may be aligned with the sides of the passivation layer 164 that also form the pad opening PDOP. Part of the gate conductive layer 150 exposed by the pad opening PDOP may be used as the wire pad WPD.

The data capping layer 152, formed together with the data conductive metal layer 151 via a single mask process, may be used as the contact electrode of the wire pad WPD. Thus, since an additional mask process that may form the contact electrode of the wire pad WPD is not needed, the process efficiency may be improved.

Figure 16:
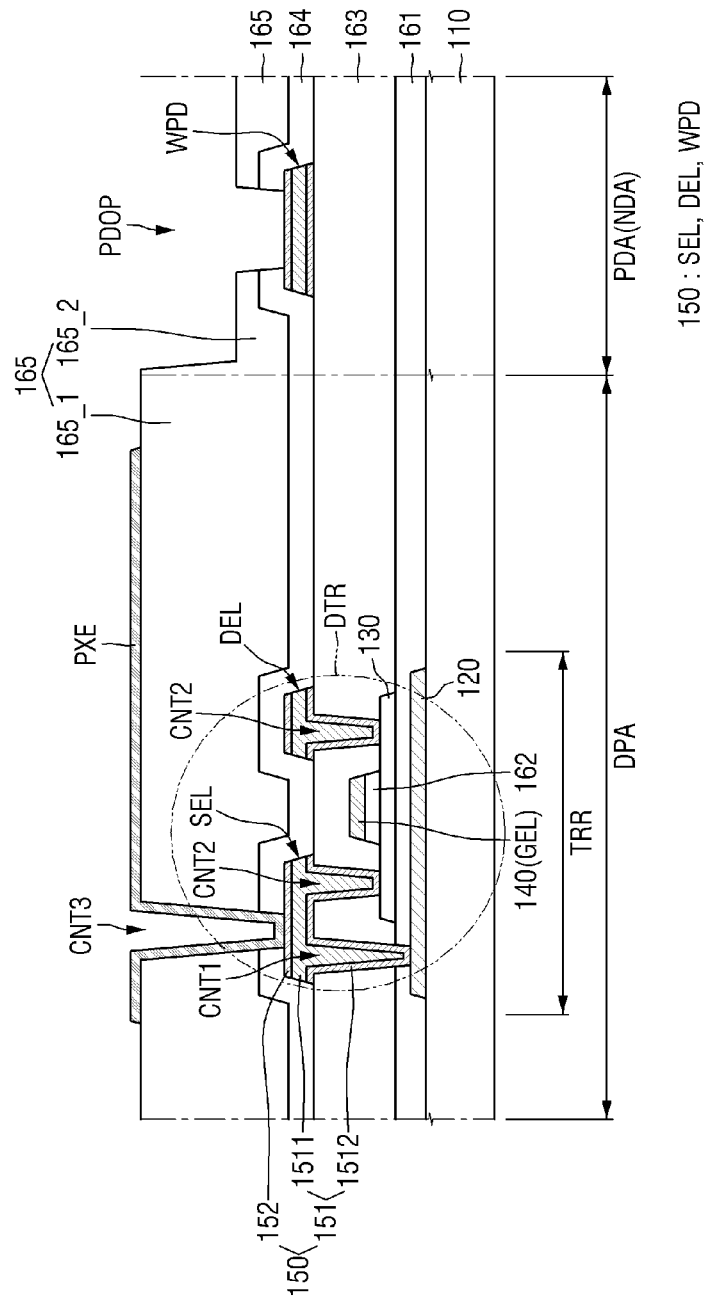

Thereafter, referring to FIG. 16, the pixel electrode PXE, which may be patterned, may be formed or disposed on the via layer 165. The pixel electrode PXE may be formed by a mask process.

As an example, a material layer for the pixel electrode PXE may be deposited on the entire surface of the via layer 165. During the deposition of the material layer for the pixel electrode PXE, the material layer for the pixel electrode PXE may be deposited even on the inside of the contact hole CNT3 and may thus be electrically connected to the source electrode SEL. Thereafter, a photoresist layer may be applied on the material layer for the pixel electrode PXE and may be subjected to exposure and development, thereby forming a photoresist pattern having the same or similar pattern shape as the pixel electrode PXE to be formed. Thereafter, the material layer for the pixel electrode PXE may be etched using the photoresist pattern as an etching mask. The material layer for the pixel electrode PXE may be wet-etched, but the disclosure is not limited thereto.

Thereafter, referring to FIG. 5, the pixel-defining film PDL, which may be patterned, may be formed or disposed on the via layer 165 where the pixel electrode PXE may be formed or disposed. For example, the pixel-defining film PDL may include an organic material containing a photosensitive material. In this example, the pixel-defining film PDL may be formed by applying an organic material layer for the pixel-defining film PDL and subjecting the organic material layer to exposure and development. The pixel-defining film PDL may be formed along the boundaries of a pixel PX and may partially overlap the pixel electrode PXE.

As described above, an additional mask process that may form the contact electrode of a wire pad may not be needed. Thus, the number of mask processes may be reduced, and as a result, the process efficiency may be improved.

A data conductive layer, formed by depositing a data main conductive layer including Cu and a data conductive capping layer including a material that may be etched slower than Cu for the same or similar etchant, may be patterned in three etching steps, for example, first through third etching steps. Since the first etching step may be performed using a first etchant to leave no residual data conductive capping film, any smudges that may be generated by over-etching a data main conductive layer including Cu may be prevented. The width of a tip structure that needs to be removed in the third etching step may be reduced.

In concluding the detailed description, those skilled in the art will appreciate that many variations and modifications can be made to the embodiments without substantially departing from the principles of the disclosure. Therefore, the disclosed embodiments are used in a generic and descriptive sense only and not for purposes of limitation.

What is claimed is:

1. A method of fabricating a conductive pattern, comprising:
    forming a conductive metal material layer and a conductive capping material layer on a substrate;
    forming a photoresist pattern as an etching mask on the conductive capping material layer;
    forming a first conductive capping pattern by etching the conductive capping material layer with a first etchant;
    forming a conductive metal layer and a second conductive capping pattern by etching the conductive metal material layer and the first conductive capping pattern with a second etchant; and
    forming a conductive capping layer by etching the second conductive capping pattern with a third etchant,
    wherein
    the second conductive capping pattern includes a first region overlapping an upper surface of the conductive metal layer and a second region not overlapping the upper surface of the conductive metal layer, and
    the forming of the conductive capping layer comprises:
        etching the second region of the second conductive capping pattern to form the conductive capping layer.

2. The method of claim 1, wherein the forming of the conductive metal layer includes:
    forming a main metal layer below the conductive capping layer,
    wherein the main metal layer is in contact with the conductive capping layer and includes copper (Cu).

3. The method of claim 2, wherein the conductive capping layer includes at least one of an indium tin oxide (ITO) film, a titanium (Ti) film, an indium zinc oxide (IZO) film, and an indium tin zinc oxide (ITZO) film.

4. The method of claim 3, wherein the forming of the conductive capping layer includes:
    aligning sidewalls of the conductive capping layer with sidewalls of the main metal layer, or
    disposing the sidewalls of the conductive capping layer inside of the sidewalls of the main metal layer.

5. The method of claim 2, wherein the forming of the conductive metal layer includes:
    forming a conductive base layer below the main metal layer,
    wherein the conductive base layer is in contact with the main metal layer and includes titanium (Ti).

6. The method of claim 1, wherein the forming of the first conductive capping pattern comprises:
    over-etching the conductive capping material layer at an over-etch rate in a range of about 100% to about 200%, wherein
        the over-etch rate of the conductive capping material layer is determined based on a thickness of the conductive capping material layer, and
        an etching speed of the first etchant for the conductive capping material layer is higher than an etching speed of the first etchant for the conductive metal material layer; and
    forming sidewalls of the first conductive capping pattern inside of sidewalls of the photoresist pattern by the over-etching of the conductive capping material layer.

7. The method of claim 6, wherein
    the forming of the conductive capping layer comprises over-etching the second conductive capping pattern at an over-etch rate of about 10% or lower, and
    the over-etch rate of the second conductive capping pattern is determined based on a thickness of the second region of the second conductive capping pattern.

8. The method of claim 6, wherein
    the forming of the conductive metal layer comprises over-etching the conductive metal material layer at an over-etch rate of about 50% or lower, and
    the over-etch rate of the conductive metal material layer is determined based on a thickness of the conductive metal material layer.

9. The method of claim 6, wherein the forming of the first conductive capping pattern comprises:
    exposing a region of the conductive metal material layer that does not overlap the photoresist pattern.

10. The method of claim 1, wherein an etching speed of the second etchant for the conductive capping material layer is lower than an etching speed of the second etchant for the conductive metal material layer.

11. The method of claim 10, wherein
    the first etchant and the third etchant are a same etchant, and
    an etching duration of the etching of the conductive capping material layer with the first etchant is longer than an etching duration of the etching of the second conductive capping pattern with the third etchant.

12. The method of claim 10, wherein
    the first etchant and the third etchant are different etchants, and
    an etching speed of the third etchant for the conductive capping material layer is lower than an etching speed of the first etchant for the conductive capping material layer.

13. The method of claim 1, further comprising:
    removing the photoresist pattern after forming the conductive capping layer.

14. A method of fabricating a display device, comprising:
    preparing a substrate including a display area and a pad area;
    forming a data conductive layer including:
        source and drain electrodes disposed in the display area and a wire pad disposed in the pad area;
        a data conductive metal layer disposed on the substrate; and
        a data capping layer disposed on the data conductive metal layer, wherein the forming of the data conductive layer comprises:

forming a material layer for the data conductive metal layer and a material layer for the data capping layer on the substrate;

forming a photoresist pattern as an etching mask on the material layer for the data capping layer;

forming a first data capping pattern layer by etching the material layer for the data capping layer with a first etchant;

forming the data conductive metal layer and a second data capping pattern layer on the data conductive metal layer, by etching the material layer for the data conductive metal layer and the first data capping pattern layer on the material layer for the data conductive metal layer with a second etchant; and forming the data capping layer by etching the second data capping pattern layer with a third etchant, and wherein the forming of the first data capping pattern layer includes exposing a part of the material layer for the data conductive metal layer that does not overlap the photoresist pattern.

15. The method of claim 14, wherein the forming of the data conductive metal layer includes:

forming a data main metal layer below the data capping layer, wherein the data main metal layer is in contact with the data capping layer and includes copper (Cu).

16. The method of claim 15, wherein the data capping layer includes at least one of an indium tin oxide (ITO) film, a titanium (Ti) film, an indium zinc oxide (IZO) film, and an indium tin zinc oxide (ITZO) film.

17. The method of claim 15, wherein an etching speed of the second etchant for the material layer for the data capping layer is lower than an etching speed of the second etchant for the material layer for the data conductive metal layer.

18. The method of claim 17, wherein the etching of the material layer for the data conductive metal layer and the first data capping pattern layer with the second etchant includes forming in the second data capping pattern layer:

a first region that overlaps the data conductive metal layer; and a second region that does not overlap the data conductive metal layer and overlaps the photoresist pattern.

19. The method of claim 14, wherein the forming of the data capping layer comprises:

aligning sidewalls of the data capping layer with sidewalls of the data conductive metal layer, or disposing the sidewalls of the data capping layer inside of the sidewalls of the data conductive metal layer.

20. The method of claim 14, wherein the forming of the first data capping pattern layer comprises:

over-etching the material layer for the data capping layer at an over-etch rate in a range of about 100% to about 200%, wherein the over-etch rate of the material layer for the data capping layer is determined based on a thickness of the material layer for the data capping layer, and an etching speed of the first etchant for the material layer for the data capping layer is higher than an etching speed of the first etchant for the material layer for the data conductive metal layer; and forming sidewalls of the first data capping pattern layer inside of sidewalls of the photoresist pattern by the over-etching of the material layer for the data capping layer.

21. The method of claim 20, wherein the forming of the data capping layer comprises over-etching the second data capping pattern layer at an over-etch rate of about 10% or lower, the second data capping pattern layer includes a first region overlapping an upper surface of the data conductive metal layer, and a second region not overlapping the upper surface of the data conductive metal layer, and the over-etch rate of the second data capping pattern layer is determined based on a thickness of the second region of the second data capping pattern layer.

22. The method of claim 20, wherein the forming of the data conductive metal layer comprises over-etching the material layer for the data conductive metal layer at an over-etch rate of about 50% or lower, and the over-etch rate of the material layer for the data conductive metal layer is determined based on a thickness of the material layer for the data conductive metal layer.

* * * * *